(12) United States Patent
Takahashi et al.

(10) Patent No.: US 12,009,359 B2
(45) Date of Patent: Jun. 11, 2024

(54) SEMICONDUCTOR DEVICE

(71) Applicant: Murata Manufacturing Co., Ltd., Kyoto-fu (JP)

(72) Inventors: Shinnosuke Takahashi, Nagaokakyo (JP); Masayuki Aoike, Nagaokakyo (JP); Takayuki Tsutsui, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 245 days.

(21) Appl. No.: 17/504,269

(22) Filed: Oct. 18, 2021

(65) Prior Publication Data
US 2022/0157808 A1 May 19, 2022

(30) Foreign Application Priority Data
Nov. 18, 2020 (JP) .................. 2020-191828

(51) Int. Cl.
| H01L 25/065 | (2023.01) |
| H01L 25/00 | (2006.01) |
| H01L 25/16 | (2023.01) |
| H01L 25/18 | (2023.01) |
| H01L 27/02 | (2006.01) |
| H01L 27/06 | (2006.01) |
| H01L 23/00 | (2006.01) |

(52) U.S. Cl.
CPC ...... *H01L 27/0658* (2013.01); *H01L 25/0655* (2013.01); *H01L 25/0657* (2013.01); *H01L 25/16* (2013.01); *H01L 25/18* (2013.01); *H01L 25/50* (2013.01); *H01L 27/0255* (2013.01); *H01L 24/05* (2013.01); *H01L 24/13* (2013.01); *H01L 24/24* (2013.01); *H01L 2224/05644* (2013.01); *H01L 2224/08* (2013.01); *H01L 2224/08145* (2013.01); *H01L 2224/13147* (2013.01); *H01L 2224/1357* (2013.01); *H01L 2224/24146* (2013.01)

(58) Field of Classification Search
CPC ............ H01L 27/0207; H01L 27/0658; H01L 25/0657
See application file for complete search history.

(56) References Cited

U.S. PATENT DOCUMENTS

| 2015/0326182 A1* | 11/2015 | Chen ................. H01L 23/49861 330/307 |
| 2021/0036134 A1* | 2/2021 | Shiratori ............... H01L 23/367 |

FOREIGN PATENT DOCUMENTS

| JP | 2019-192721 A | 10/2019 |
| WO | 2005/096365 A1 | 10/2005 |

* cited by examiner

*Primary Examiner* — Dale E Page
*Assistant Examiner* — Wilner Jean Baptiste
(74) *Attorney, Agent, or Firm* — Studebaker & Brackett PC

(57) ABSTRACT

A semiconductor having transistors arranged side by side in one direction over a surface of a substrate and are connected in parallel. At least one passive element is disposed on at least one of regions between two adjacent ones of the transistors. The transistors each include a collector layer over the substrate, a base layer on the collector layer, and an emitter layer on the base layer. Collector electrodes are arranged in such a manner that each of the collector electrodes is located between the substrate and the collector layer of the corresponding one of the transistors and is electrically connected to the collector layer.

22 Claims, 17 Drawing Sheets

SEMICONDUCTOR DEVICE

CROSS-REFERENCE TO RELATED APPLICATION

This application claims benefit of priority to Japanese Patent Application No. 2020-191828, filed Nov. 18, 2020, the entire content of which is incorporated herein by reference.

BACKGROUND

Technical Field

The present disclosure relates to a semiconductor device.

Background Art

Heterojunction bipolar transistors (HBTs) find use as radio-frequency power amplifiers that are to be included in mobile terminals. Such a power amplifier with higher output power suffers from increased self-heating of HBTs. As the temperature of the HBTs rises due to self-heating, the collector current flowing through the HBTs increases correspondingly. The increase in collector current causes a further temperature rise in the HBTs, which in turn can eventually exhibit thermal runaway.

Thus, improved thermal dissipation properties are required of such an HBT to eliminate or reduce the possibility of thermal runaway. A highly heat-dissipative semiconductor device provided in such a way as to minimize the increase in chip area is disclosed in International Publication No. 2005/096365. This semiconductor device includes HBTs that are arranged in line on a semi-insulating substrate made of, for example, GaAs and are connected in parallel. The HBTs are each provided with collector electrodes that are disposed on opposite sides in the direction in which the HBTs are arranged side by side. The HBTs and diodes are arranged in such a manner that each diode is located between two adjacent ones of the HBTs. The diodes constitute a heat transfer path extending from the HBTs to the semi-insulating substrate made of GaAs or the like.

SUMMARY

With a trend toward a mobile terminal including more and more constituent components, there has been a demand for a further reduction in the size of semiconductor devices such as power amplifiers. Therefore, the present disclosure provides a semiconductor device that includes multiple semiconductor elements in such a way as to adapt to the demand for miniaturization.

According to an aspect of the present disclosure, a semiconductor device includes a substrate, transistors, at least one passive element, and collector electrodes. The transistors are arranged side by side in one direction over a surface of the substrate and are connected in parallel. The at least one passive element is disposed on at least one of regions between two adjacent ones of the transistors. The transistors each include a collector layer over the substrate, a base layer on the collector layer, and an emitter layer on the base layer. The collector electrodes are arranged in such a manner that each of the collector electrodes is located between the substrate and the collector layer of the corresponding one of the transistors and is electrically connected to the collector layer.

With each of the collector electrodes being disposed between the substrate and the corresponding one of the transistors, the semiconductor device is smaller than if each of the collector electrodes is disposed beside the corresponding one of the transistors on the substrate. A preferred approach to suppressing rises in the temperature of the transistors requires that a certain degree of spacing be left between two adjacent ones of the transistors. The spacing is used as the mounting place for the at least one passive element. This layout enables efficient use of the available space on the substrate, leading to a further reduction in the size of the semiconductor device.

Other features, elements, characteristics, and advantages of the present disclosure will become more apparent from the following detailed description of preferred embodiments of the present disclosure with reference to the attached drawings.

DETAILED DESCRIPTION

Example 1

The following describes a semiconductor device in Example 1 with reference to FIGS. 1 to 4D.

Figure 1:
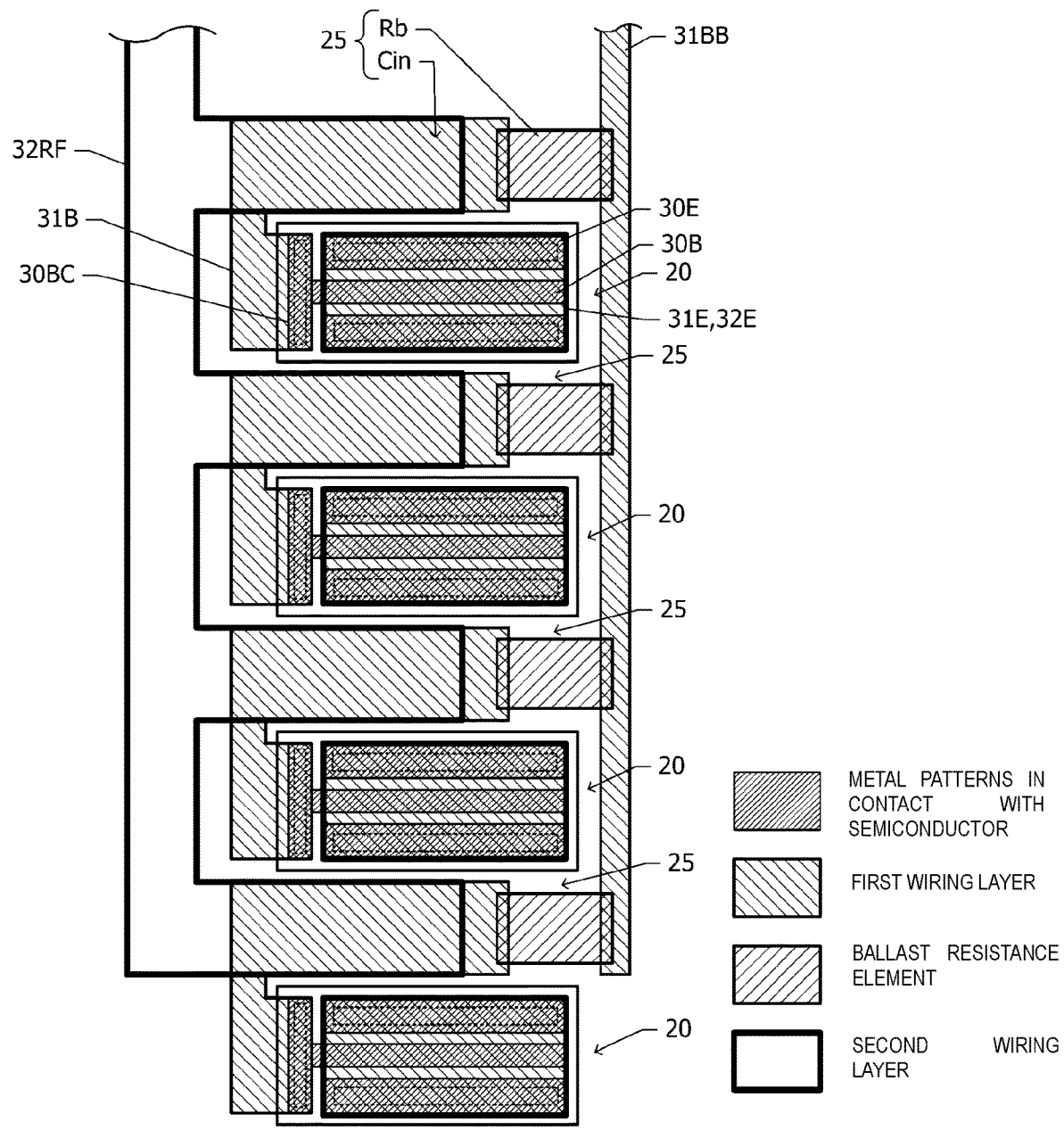
FIG. 1 illustrates the planar positional relationship between constituent elements such as electrodes and wiring of a semiconductor device in Example 1.

FIG. 1 illustrates the planar positional relationship between constituent elements such as electrodes and wiring of the semiconductor device in Example 1. The semiconductor device includes a first member and transistors 20. The first member may, for example be a semiconductor substrate. The transistors 20 have approximately the same properties and are arranged side by side in one direction over a surface (upper surface) of the first member. The transistors 20 may, for example, be heterojunction bipolar transistor (HBTs) and are connected in parallel. Multiple transistors having approximately the same properties and connected in parallel are termed a multicell configuration.

The transistors 20 are provided with passive elements 25, each of which is disposed between two adjacent ones of the transistors 20. With two transistors 20 being disposed on opposite sides of each passive element 25, the passive element 25 is electrically connected to one of the two transistors 20. One of the passive elements 25 that is connected to one of two transistors 20 at both ends is not located between the transistor 20 at one end and the transistor 20 adjacent thereto and is located outside the array of the transistors 20. The passive elements 25 in Example 1 each include an input capacitor Cin and a ballast resistance element Rb.

The transistors 20 are each connected with two emitter electrodes 30E and a base electrode 30B. The emitter electrodes 30E and the base electrode 30B of each transistor 20 are in contact with a semiconducting portion. Referring to FIG. 1, these metal patterns in contact with the semiconducting portion are densely hatched with lines slanting up from left to right. The transistors 20 may each be connected with one emitter electrode 30E or may each be connected with three or more emitter electrodes 30E. When viewed in plan, the emitter electrodes 30E are substantially rectangular in shape or may have any other shape whose longitudinal direction is orthogonal to the direction in which the transistors 20 are arranged side by side.

The base electrodes 30B are substantially T-shaped when viewed in plan. The substantially T-shaped base electrodes 30B each include a portion extending lengthwise and located between two adjacent emitter electrodes 30E and a portion extending breadthwise (hereinafter referred to as a base contact portion 30BC) and being adjacent to end portions of the two emitter electrodes 30E with a space left between the base contact portion 30BC and each of the end portions of the two emitter electrodes 30E in the longitudinal direction thereof.

The transistors 20, the emitter electrodes 30E, and the base electrodes 30B are overlaid with a multilayer wiring structure, which covers the bulk of the substrate and includes interlayer insulating films and wiring layers. Referring to FIG. 1, metal patterns in a first wiring layer are less densely hatched with lines slanting down from left to right, and metal patterns in a second wiring layer are shown in bold outline. No interlayer insulating film is located between the first wiring layer and each ballast resistance element Rb. Referring to FIG. 1, the ballast resistance elements Rb are less densely hatched with lines slanting up from left to right.

First-layer base lines 31B extend through openings in an interlayer insulating film disposed thereunder and are connected to the respective base contact portions 30BC accordingly. In FIG. 1, the openings in the interlayer insulating film are denoted by broken lines. Each base line 31B is composed of: a portion extending from the base contact portion 30BC to the outside of the corresponding transistor 20 in a direction orthogonal to the direction in which the transistors 20 are arranged side by side; a portion that is located between two adjacent transistors 20; and a portion that forms a connection between these two portions.

A radio-frequency signal input line 32RF is laid on one side of the array of the transistors 20, and a base bias line 31BB is laid on the opposite side of the array of the transistors 20. The radio-frequency signal input line 32RF is included in the second wiring layer, and the base bias line 31BB is included in the first wiring layer.

The radio-frequency signal input line 32RF is comb teeth-shaped when viewed in plan. Teeth-shaped portions of the radio-frequency signal input line 32RF each extend in a manner so as to overlap a region between two adjacent transistors 20. The teeth-shaped portions of the radio-frequency signal input line 32RF overlap the respective first-layer base lines 31B when viewed in plan. The input capacitors Cin are provided in the overlapping regions.

Each portion being part of the corresponding base line 31B and located between two adjacent transistors 20 is connected to the base bias line 31BB, with the corresponding ballast resistance element Rb therebetween. When viewed in plan, each ballast resistance element Rb overlaps the corresponding first-layer base line 31B and the base bias line 31BB and is thus electrically connected to the base line 31B and the base bias line 31BB, with no interlayer insulating film being located between the ballast resistance element Rb and the base line 31B and between the ballast resistance element Rb and the base bias line 31BB.

When viewed in plan, two emitter electrodes 30E connected to one transistor 20 are located within a first-layer emitter line 31E and a second-layer emitter line 32E. The second-layer emitter line 32E is electrically connected to the two emitter electrodes 30E, with the first-layer emitter line 31E being located between the second-layer emitter line 32E and each of the two emitter electrodes 30E.

Figure 2A:
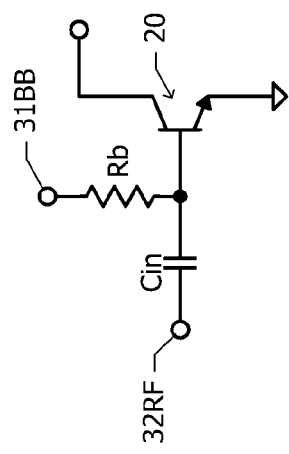
FIG. 2A is a diagram of an equivalent circuit including one of transistors of the semiconductor device in Example 1 and a passive element connected to the transistor.

FIG. 2A is a diagram of an equivalent circuit including one of the transistors 20 of the semiconductor device in Example 1 and a passive element connected to the transistor 20. The input capacitor Cin is connected between the base of the transistor 20 and the radio-frequency signal input line 32RF. The ballast resistance element Rb is connected between the base of the transistor 20 and the base bias line 31BB.

The emitter of the transistor 20 is grounded. A power supply voltage is applied to the collector of the transistor 20, and an amplified radio-frequency signal is output from the collector accordingly.

Figure 2B:
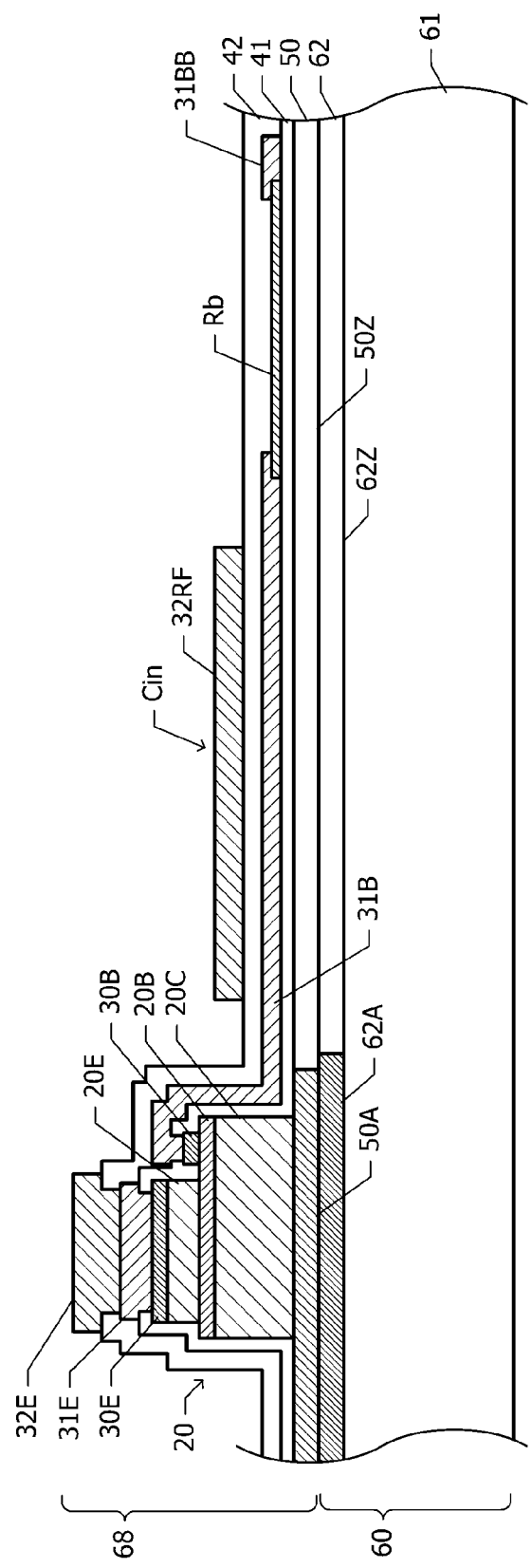
FIG. 2B illustrates a cross-sectional structure representing the connection relationship between one of the transistors of the semiconductor device in Example 1, an input capacitor, and a ballast resistance element.

FIG. 2B illustrates a cross-sectional structure representing the connection relationship between one of the transistors 20 of the semiconductor device in Example 1, the corresponding input capacitor Cin, and the corresponding ballast resistance element Rb. Note that FIG. 2B illustrates the electrical connection relationship and does not necessarily represent the actual cross section of the structure.

The semiconductor device in Example 1 includes a first member 60 and a second member 68. The first member 60 includes a substrate 61 and a bonding layer 62. The substrate 61 is made of an elemental semiconductor, such as silicon or germanium. The bonding layer 62 is disposed on a surface of the substrate 61. The substrate 61 may, for example, be a silicon substrate or a silicon-on-insulator (SOI) substrate. The substrate 61 may include a multilayer wiring structure disposed between the bonding layer 62 and a silicon or SOI substrate. When viewed in plan, the bonding layer 62 is divided into a metal region 62A and an insulating region 62Z.

The second member 68 includes a base semiconductor layer 50. The base semiconductor layer 50 and the bonding layer 62 have surface contact such that the second member 68 is bonded to the first member 60. The base semiconductor layer 50 is divided into a conductive region 50A and an element isolation region 50Z. When viewed in plan, the conductive region 50A and the metal region 62A overlap each other. The conductive region 50A and the metal region 62A are electrically connected to each other. The base semiconductor layer 50 may, for example, be made of GaAs. The conductive region 50A is made of n-type GaAs. The element isolation region 50Z is formed by ion implantation of insulating impurities into an n-type GaAs layer.

The transistor 20 is disposed on the conductive region 50A. The transistor 20 includes a collector layer 20C on the conductive region 50A, a base layer 20B on the collector layer 20C, and an emitter layer 20E on the base layer 20B. The base layer 20B is partially overlaid with the emitter layer 20E. The collector layer 20C may, for example, be made of n-type GaAs, and the base layer 20B may, for example, be made of p-type GaAs. The emitter layer 20E may include two layers or, more specifically, an n-type InGaP layer and an n-type GaAs layer on the n-type InGaP layer. The transistor 20 is thus regarded as a heterojunction bipolar transistor.

The base electrode 30B is disposed on the base layer 20B and is electrically connected to the base layer 20B. The emitter electrode 30E is disposed on the emitter layer 20E and is electrically connected to the emitter layer 20E. The collector layer 20C is electrically connected to the metal region 62A, with the conductive region 50A therebetween. The metal region 62A acts as a collector electrode. The collector electrode is opposite the transistor 20, with the base semiconductor layer 50 therebetween. The collector layer 20C and the collector electrode overlap each other when viewed in plan.

The base semiconductor layer 50 is overlaid with a first-layer interlayer insulating film 41, which covers the transistor 20, the base electrode 30B, and the emitter electrode 30E. The first-layer interlayer insulating film 41 may, for example, be made of an inorganic insulating material, such as SiN. The interlayer insulating film 41 has openings.

The first-layer emitter line 31E, the base line 31B, the base bias line 31BB, and the ballast resistance element Rb are disposed on the interlayer insulating film 41. The emitter line 31E extends through an opening in the interlayer insulating film 41 and is connected to the emitter electrode 30E accordingly. The base line 31B extends through another opening in the interlayer insulating film 41 and is connected to the base electrode 30B accordingly.

The base line 31B extends in a manner so as to overlap a region on which none of the transistors 20 is disposed. A tip of the base line 31B overlaps one of two opposite end portions of the ballast resistance element Rb. The base line 31B and the ballast resistance element Rb are electrically connected to each other in the overlapping region. The other end portion of the ballast resistance element Rb overlaps the base bias line 31BB. The ballast resistance element Rb and the base bias line 31BB are electrically connected to each other in the overlapping region.

The interlayer insulating film 41 is overlaid with a second-layer interlayer insulating film 42, which covers the first-layer emitter line 31E, the base line 31B, the ballast resistance element Rb, and the base bias line 31BB. As with the interlayer insulating film 41, the second-layer interlayer insulating film 42 is made of an inorganic insulating material, such as SiN.

The second-layer emitter line 32E and the radio-frequency signal input line 32RF are disposed on the interlayer insulating film 42. The second-layer emitter line 32E extends through an opening in the interlayer insulating film 42 and is connected to the first-layer emitter line 31E accordingly. At least part of the radio-frequency signal input line 32RF overlaps the first-layer base line 31B when viewed in plan. The input capacitor Cin is provided in the overlapping region. The first-layer base line 31B, the radio-frequency signal input line 32RF in the second wiring layer, and the second-layer interlayer insulating film 42 act as a lower electrode, an upper electrode, and a dielectric film, respectively, of the input capacitor Cin.

A third wiring layer and conductor protrusions for connection to external circuits are disposed on the second-layer emitter line 32E, the radio-frequency signal input line 32RF, and the interlayer insulating film 42. The third wiring layer and the conductor protrusions are not illustrated in FIG. 2B. Examples of the conductor protrusions include: a Cu pillar bump including a Cu pillar and solder applied to an upper surface of the Cu pillar; an Au bump including a pillar with no solder applied to an upper surface of the pillar; a post including a pad and a pillar disposed upright on the pad; and a ball bump that is a solder ball obtained by reflowing.

Figure 3A:
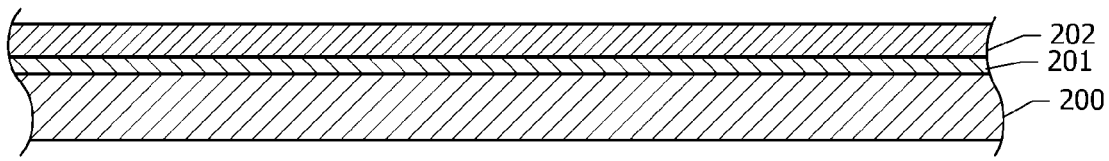
FIGS. 3A to 3F are sectional views of semiconductor devices in the process of being produced.
Figure 3B:
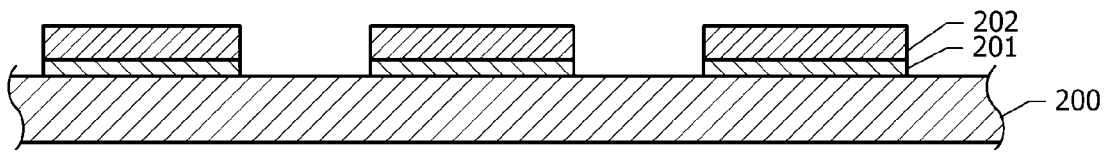
Figure 3C:
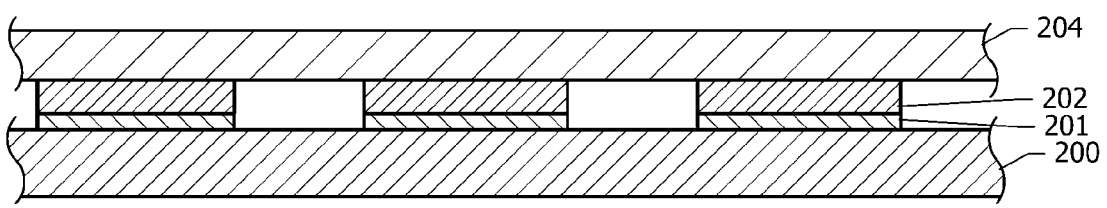
Figure 3D:
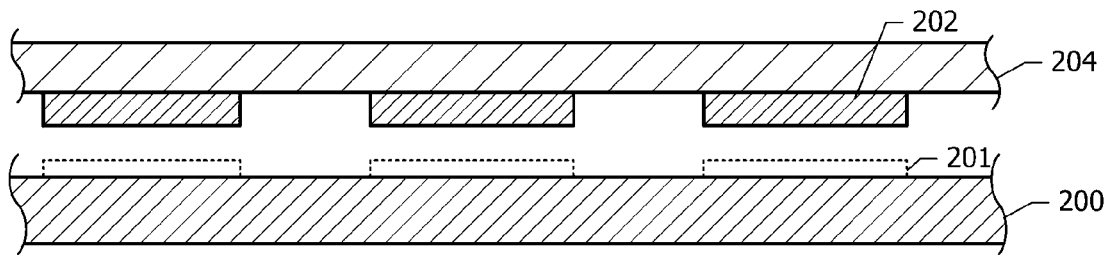
Figure 3E:
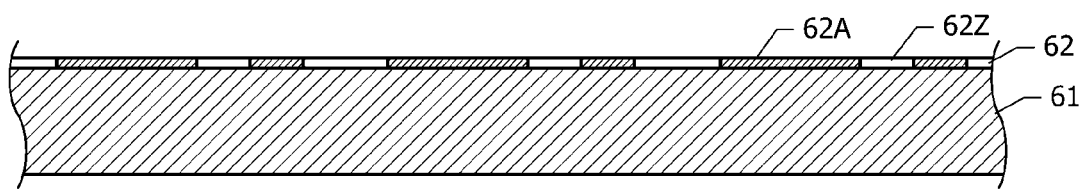
Figure 3F:
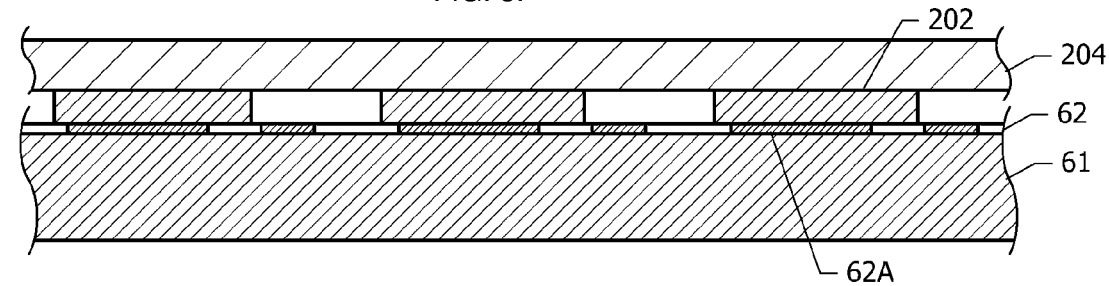
Figure 4A:
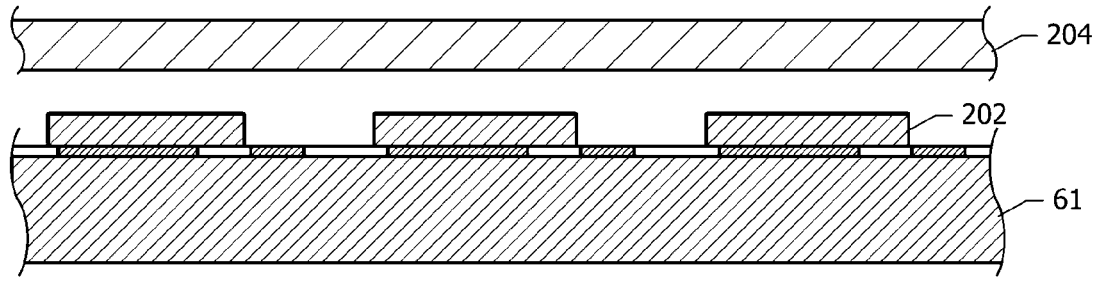
FIGS. 4A to 4C are sectional views of semiconductor devices in the process of being produced.
Figure 4B:
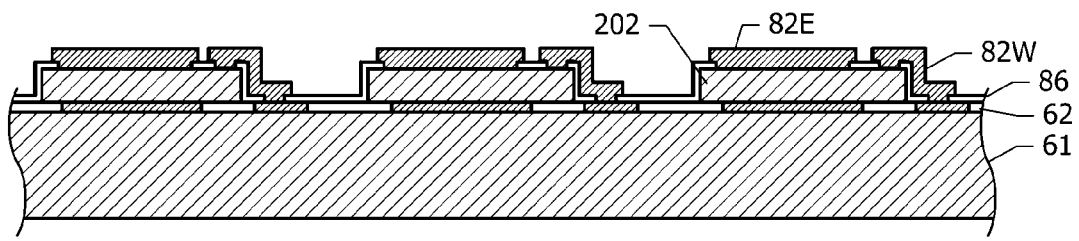
Figure 4C:
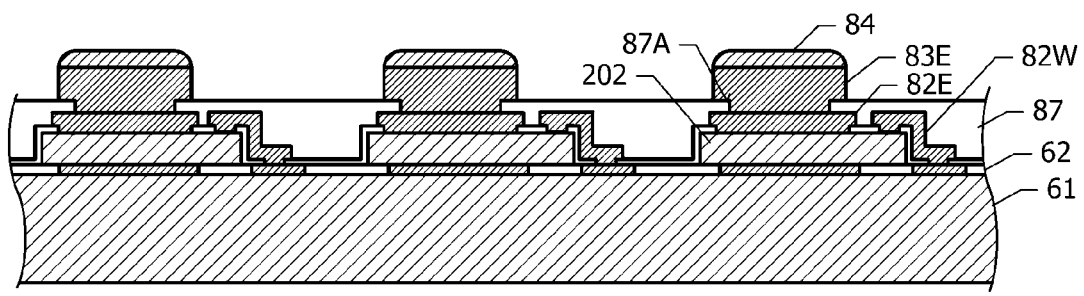
Figure 4D:
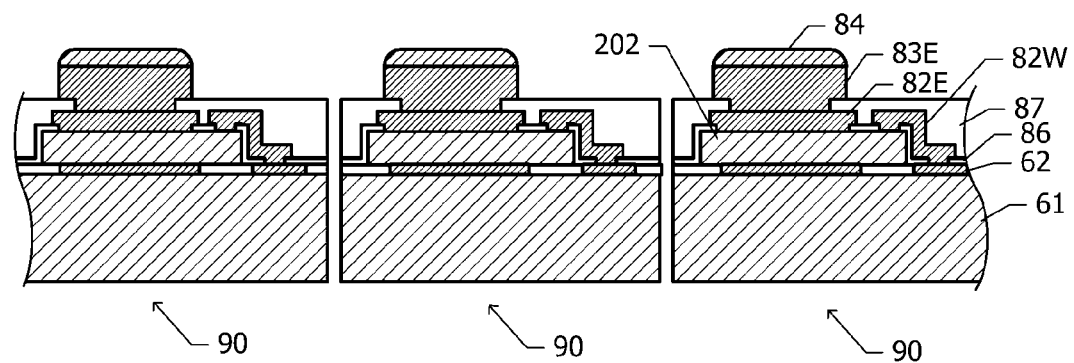
FIG. 4D is a sectional view of the semiconductor devices in finished form.

The following describes a method for producing a semiconductor device in Example 1 with reference to FIGS. 3A to 4D. FIGS. 3A to 4C are sectional views of semiconductor devices in the process of being produced, and FIG. 4D is a sectional view of the semiconductor devices in finished form.

Referring to FIG. 3A, a release layer 201 is epitaxially grown on a mother substrate 200, which is made of a single-crystal compound semiconductor, such as GaAs. An element-forming layer 202 is then formed on the release layer 201. The element-forming layer 202 includes the element structure illustrated in FIG. 2. The element structure includes the base semiconductor layer 50, the transistors 20, and multiple wiring layers formed thereon. The element structure is fabricated by means of a commonly used semiconductor process. The element structure included in the element-forming layer 202 is not illustrated in FIG. 3A. The element structure in the element-forming layer 202 in this state is a one-piece structure including multiple semiconductor devices and is yet to be separated into individual semiconductor devices.

Referring to FIG. 3B, the element-forming layer 202 and the release layer 201 are then patterned by using a resist pattern (not illustrated) as an etching mask. In this stage, the element-forming layer 202 is separated into individual semiconductor devices.

Referring to FIG. 3C, a connecting supporter 204 is laid on and bonded to the element-forming layer 202 separated in pieces. The connecting supporter 204 forms a connection between the individual pieces into which the element-forming layer 202 is separated. The resist pattern used as an etching mask in the patterning process in FIG. 3B may be left unremoved such that the resist pattern is located between the element-forming layer 202 and the connecting supporter 204.

Referring to FIG. 3D, the release layer 201 on the mother substrate 200 and the element-forming layer 202 is then selectively etched. Consequently, the element-forming layer 202 and the connecting supporter 204 are released from the mother substrate 200. For selective etching, the release layer 201 is made of a compound semiconductor whose etching resistance is not equal in degree to the etching resistance of the mother substrate 200 and to the etching resistance of the element-forming layer 202.

Referring to FIG. 3E, the bonding layer 62 is formed on the upper surface of the substrate 61. The bonding layer 62 includes more than one metal region 62A and the insulating region 62Z. The metal regions 62A are dispersedly located within a plane. The bonding layer 62 may, for example, be formed by a damascene process.

Referring to FIG. 3F, the element-forming layer 202 and the bonding layer 62 are joined together. The element-forming layer 202 and the bonding layer 62 are joined together by van der Waals bonding or hydrogen bonding. Alternatively, the element-forming layer 202 and the bonding layer 62 may be joined together by electrostatic force, covalent bonding, or eutectic alloy bonding. In a case that the metal regions 62A are made of Au, the element-forming layer 202 may be brought into close contact with an Au film and may be joined to the Au film by application of pressure.

Referring to FIG. 4A, the connecting supporter 204 is removed from the element-forming layer 202. Referring to FIG. 4B, after the connecting supporter 204 is removed, an interlayer insulating film 86 and a redistribution layer are formed on the bonding layer 62 and the element-forming layer 202. The redistribution layer includes emitter pads 82E and interconnection lines 82W. The emitter pads 82E are disposed on the second-layer emitter lines 32E (see FIG. 2B). Each of interconnection lines 82W connects the corresponding one of the metal regions 62A of the bonding layer 62 to circuitry in the element-forming layer 202. In this way, the interconnection lines 82W form a connection between circuitry included in the first member 60 (see FIG. 2B) and circuitry included in the second member 68 (see FIG. 2B).

Referring to FIG. 4C, a protective film 87 is formed on the redistribution layer, and openings 87A are formed in the protective film 87. Each of the openings 87A is located within the corresponding one of the emitter pads 82E when viewed in plan. Emitter conductor protrusions 83E are formed in a manner so as to extend through the respective openings 87A and jut out from the protective film 87. Solder 84 is applied to top surfaces of the emitter conductor protrusions 83E, which are then subjected to a reflow process. The emitter conductor protrusions 83E may be made of copper, and each emitter conductor protrusion 83E and the solder 84 may constitute a Cu pillar bump.

Referring to FIG. 4D, the substrate 61 is cut into pieces with a dicing machine in the final stage to obtain semiconductor devices, each of which is denoted by 90 and includes the substrate 61, the bonding layer 62, the element-forming layer 202, the emitter pad 82E, the emitter conductor protrusion 83E, and the interconnection line 82W. The first member 60 of each of the individual semiconductor devices 90 is greater than the element-forming layer 202 (the second member 68) thereof when viewed in plan. The individual semiconductor devices 90 are mounted on a module substrate or the like by flip-chip mounting.

The following describes advantageous effects of Example 1.

In Example 1, the metal region 62A (see FIG. 2B) is located between the transistor 20 and the substrate 61 to act as a collector electrode. Known semiconductor devices typically include collector electrodes disposed on the conductive region 50A. Thus, each transistor 20 and the corresponding collector electrode inevitably have no overlap when viewed in plan. That is, two adjacent transistors 20, such as the ones illustrated in FIG. 1, are typically arranged side by side with a collector electrode therebetween.

Unlike the collector electrodes of such a known semiconductor device, collector electrodes of the semiconductor device in Example 1 are the metal regions 62A overlapping the respective transistors 20. This configuration enables a reduction in the dimensional increase of the semiconductor device viewed in plan.

In a case that two adjacent ones of the transistors 20 are close to each other without the passive element (see FIG. 1) therebetween, heat-producing components are packed in confined areas, and the transistors 20 tend to be raised in temperature accordingly. As a workaround, two adjacent ones of the transistors 20 in Example 1 are arranged side by side with the passive element 25 therebetween. The passive elements 25 are not heat-producing components and help ensure that a certain degree of spacing is left between the transistors 20. The heat-producing components in this example are not packed in confined areas such that excessive rises in the temperature of the transistors 20 are suppressed.

Simply increasing the spacing between the transistors 20 for the purpose of suppressing temperature rises will result in a dimensional increase of the semiconductor device viewed in plan. In Example 1, the increased spacing between the transistors 20 is efficiently used to as a mounting place for the passive element. In this way, a dimensional increase of the semiconductor device viewed in plan is inhibited.

The following describes a modification of Example 1.

The substrate 61 (see FIG. 2B) of the first member 60 in Example 1 is made of an elemental semiconductor, such as silicon or germanium. In this modification, the substrate 61 may be made of a compound semiconductor, such as GaAs or SiC.

In terms of heat dissipation properties, certain particular materials are preferred for the substrate 61 of the first member 60 (see FIG. 2B), as will be described below. Heat generated by the transistor 20 is transferred to the first member 60 and is then diffused in the first member 60. Heat diffused in the first member 60 is dissipated from a surface of the first member 60 to the outside. Thus, heat dissipation through the first member 60 needs to be improved. To that end, the substrate 61 of the first member 60 is preferably made of a highly thermally conductive semiconductor material. More specifically, the substrate 61 is preferably made of a semiconductor material that is more thermally conductive than the compound semiconductors included in the transistors 20. In terms of heat dissipation properties, it is preferred that the first member 60 be principally made of, for example, an elemental semiconductor or SiC. Examples of the elemental semiconductor include Si and Ge.

In Example 1, the emitter conductor protrusions 83E (see FIG. 4D) constitute a heat transfer path extending from the transistors 20 to the module substrate. The heat transfer path extending from the transistor 20 to the substrate 61 is thus supplemented by the heat transfer path extending through the emitter conductor protrusions 83E to the module substrate. The semiconductor device including these two paths exhibits improved heat dissipation properties.

The following describes another modification of Example 1.

In Example 1 (see FIG. 1), all of the regions between two adjacent ones of the transistors 20 arranged side by side in one direction are the mounting places for the respective passive elements 25. In this modification, at least one passive element 25 is disposed on at least one of regions between two adjacent ones of the transistors 20, and no passive element 25 is mounted on the other regions. For example, every second region between two adjacent ones of the transistors 20 may be the mounting place for the corresponding passive element 25. The spacing between two transistors 20 adjacent to each other with no passive element 25 therebetween is narrower than the spacing between two transistors 20 adjacent to each other with the passive element 25 therebetween.

For example, every second region between two adjacent ones of the transistors 20 may be the mounting place for the corresponding input capacitor Cin and the corresponding ballast resistance element Rb. In this case, two adjacent transistors 20 share one ballast resistance element Rb and one input capacitor Cin that are located between the transistors 20.

The distribution density of the transistors 20 in this modification is lower than the distribution density of the transistors 20 tightly packed with no passive element 25 therebetween. As in Example 1, excessive rises in the temperature of the transistors 20 may be suppressed accordingly. This modification, in which two adjacent transistors 20 share the passive element 25 (i.e., one input capacitor Cin and one ballast resistance element Rb) located therebetween, is also advantageous in that a further dimensional reduction of the semiconductor device viewed in plan is achieved.

Example 2

Figure 5:
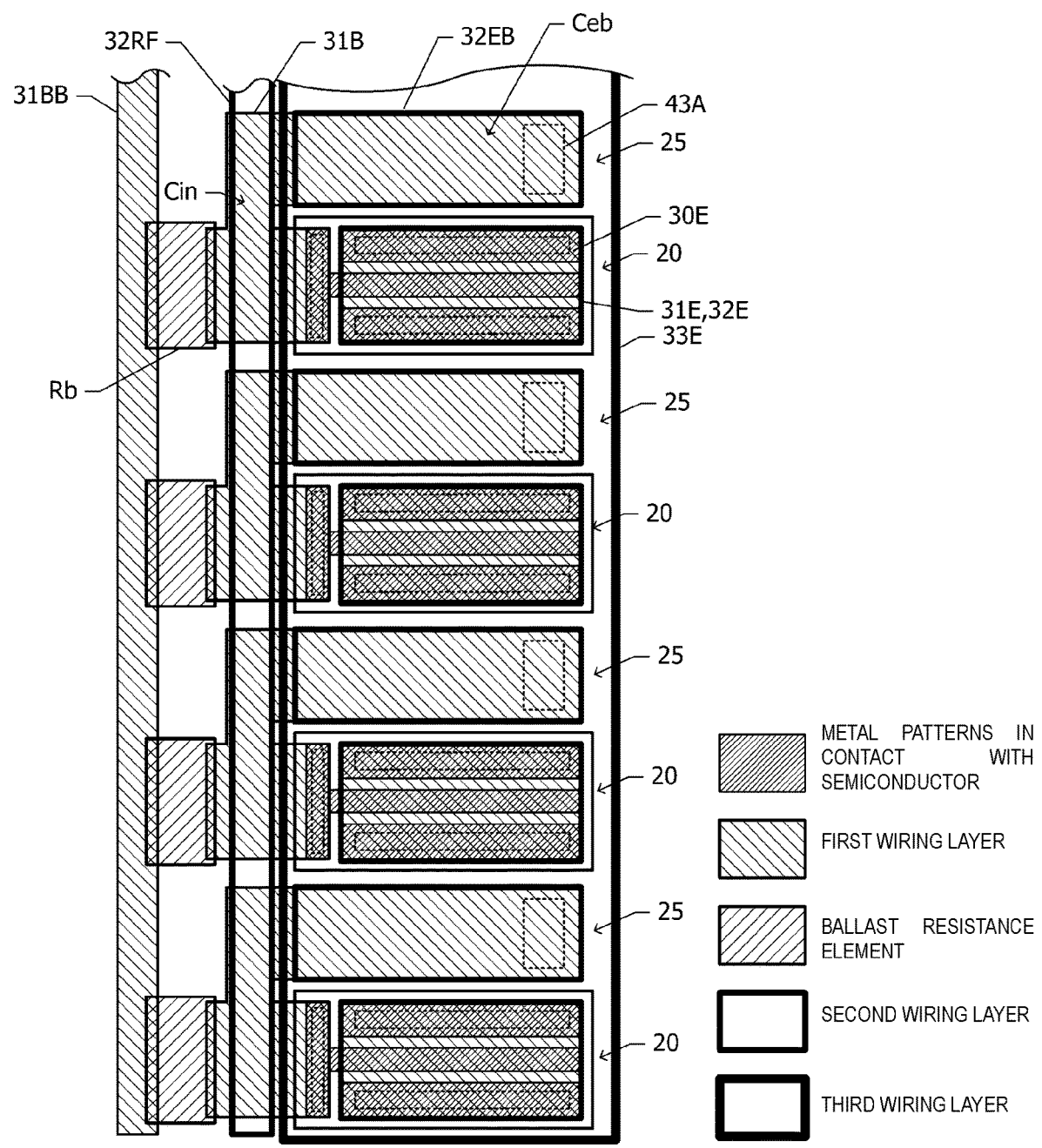
FIG. 5 illustrates the planar positional relationship between constituent elements such as electrodes and wiring of a semiconductor device in Example 2.
Figure 6A:
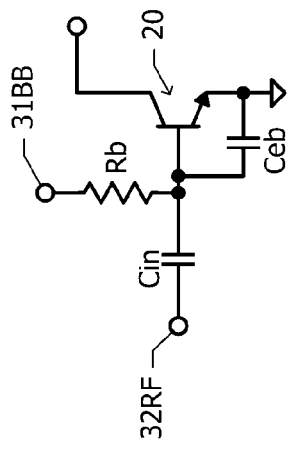
FIG. 6A is a diagram of an equivalent circuit including one of transistors of the semiconductor device in Example 2 and a passive element connected to the transistor.
Figure 6B:
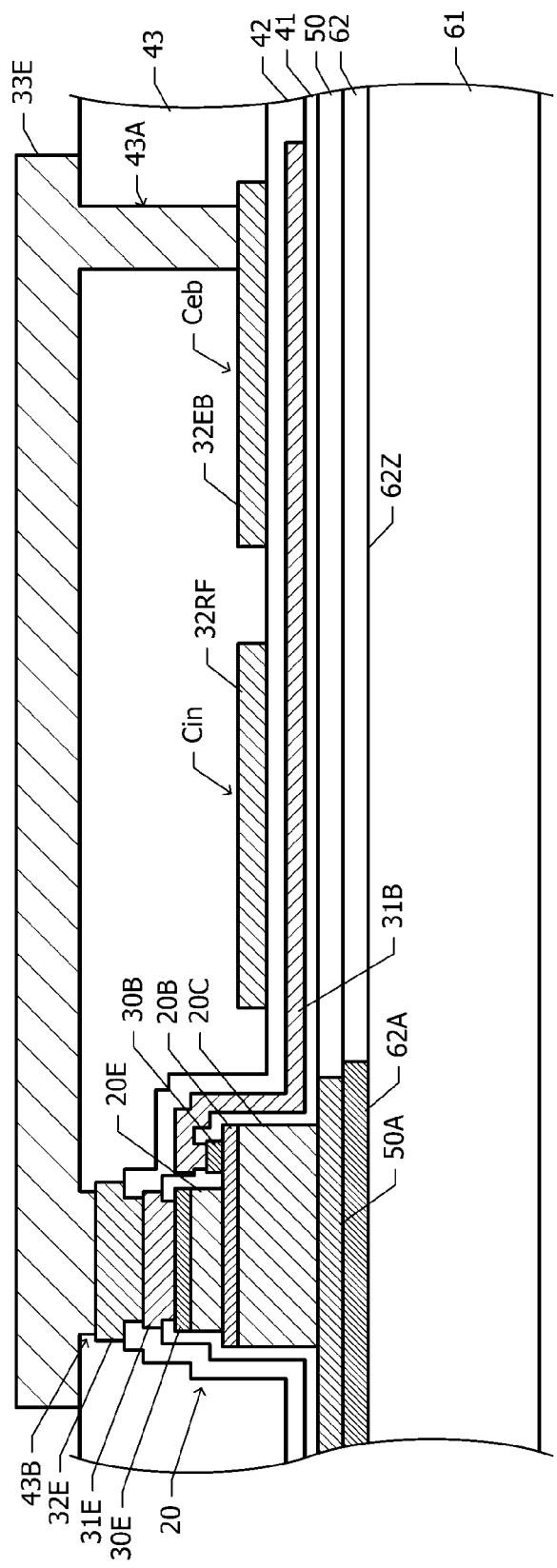
FIG. 6B illustrates a cross-sectional structure representing the connection relationship between one of the transistors of the semiconductor device in Example 2, an input capacitor, and an emitter-base-junction capacitor.

The following describes a semiconductor device in Example 2 with reference to FIGS. 5, 6A, and 6B. The configuration common to the semiconductor device in Example 1 and the semiconductor device in Example 2 is as has been described above with reference to FIGS. 1 to 4D and will not be further elaborated here.

FIG. 5 illustrates the planar positional relationship between constituent elements such as electrodes and wiring of the semiconductor device in Example 2. In Example 1, the passive elements 25 (see FIG. 1) each located between two adjacent ones of the transistors 20 include the respective input capacitors Cin and the respective ballast resistance element Rb. In Example 2, the passive elements 25 each include an emitter-base-junction capacitor Ceb.

The two transistors 20 are arranged side by side with an electrode 32EB therebetween. The electrodes 32EB are included in the second wiring layer. The first-layer base lines 31B each extend in a manner so as to overlap the respective electrodes 32EB when viewed in plan. Each emitter-base-junction capacitor Ceb is provided in the overlap between the corresponding base line 31B and the corresponding electrode 32EB.

A third-layer emitter line 33E extends over the transistors 20 and the passive elements 25. Referring to FIG. 5, the metal patters in the second wiring layer are shown in bold outline, and the third-layer emitter line 33E is shown in bolder outline. The third-layer emitter line 33E is electrically connected to the emitter electrodes 30E, with the second-layer emitter line 32E and the first-layer emitter line 31E being located between the third-layer emitter line 33E and each of the emitter electrodes 30E. In this way, the third-layer emitter line 33E forms a connection between the transistors 20 or, more specifically, a connection between the emitter electrodes 30E of the transistors 20. The third-layer emitter line 33E extends through openings 43A in an interlayer insulating film disposed thereunder and is electrically connected to the electrodes 32EB of the emitter-base-junction capacitors Ceb.

The radio-frequency signal input line 32RF and the base bias line 31BB in Example 1 (see FIG. 1) are laid on opposite sides of the array of the transistors 20. Both the radio-frequency signal input line 32RF and the base bias line 31BB in Example 2 are laid on one side of the array of the transistors 20. The radio-frequency signal input line 32RF is closer than the base bias line 31BB to the transistors 20.

The first-layer base lines 31B are extended from the respective transistors 20 to one side of the radio-frequency signal input line 32RF and cross the radio-frequency signal input line 32RF. The first-layer base lines 31B include their respective protrusions extending beyond the other side of the radio-frequency signal input line 32RF. Each of the protrusions is connected with one end of the corresponding one of the ballast resistance elements Rb. The other end of the ballast resistance element Rb is connected to the base bias line 31BB. Each input capacitor Cin is provided in the overlap between the corresponding first-layer base line 31B and the radio-frequency signal input line 32RF.

FIG. 6A is a diagram of an equivalent circuit including one of the transistors 20 of the semiconductor device in Example 2 and a passive element connected to the transistor 20. The configuration in Example 2 is similar to the configuration in Example 1 (see FIG. 2A) except that the emitter-base-junction capacitor Ceb is connected between the base and the emitter of the transistor 20.

FIG. 6B illustrates a cross-sectional structure representing the connection relationship between one of the transistors 20 of the semiconductor device in Example 2, the corresponding input capacitor Cin, and the corresponding emitter-base-junction capacitor Ceb. The connecting structure that forms a connection between the transistor 20 and the input capacitor Cin is similar to the connecting structure in Example 1 (see FIG. 2B). The second wiring layer in Example 2 includes the electrode 32EB as well as the radio-frequency signal input line 32RF and the emitter line 32E. The electrode 32EB overlaps the first-layer base line 31B when viewed in plan.

The interlayer insulating film 42 is overlaid with a third-layer interlayer insulating film 43, which covers the second-layer emitter line 32E, the radio-frequency signal input line 32RF, and the electrode 32EB. The third-layer emitter line 33E is disposed on the interlayer insulating film 43. The third-layer emitter line 33E extends through the opening 43A in the interlayer insulating film 43 and is connected to the electrode 32EB accordingly. The third-layer emitter line 33E extends through an opening 43B in the interlayer insulating film 43 and is connected to the second-layer emitter line 32E accordingly.

The third-layer interlayer insulating film 43 corresponds to the interlayer insulating film 86 (see FIG. 4D), and the third-layer emitter line 33E corresponds to the emitter pads 82E (see FIG. 4D). In Example 2, the interlayer insulating film 86 (see FIG. 4D) has a flat upper surface.

The following describes advantageous effects of Example 2.

As with the semiconductor device in Example 1, the semiconductor device in Example 2 achieves a reduction in size and suppresses excessive rises in the temperature of the transistors 20. The emitter-base-junction capacitor Ceb in Example 2 enables modulation of input waveforms, which leads to a higher degree of efficiency.

The following describes modifications of Example 2.

The third-layer emitter line 33E (see FIG. 6B) in Example 2 is part of the redistribution layer formed in the process illustrated in FIG. 4B. Alternatively, the third-layer interlayer insulating film 43 and the third-layer emitter line 33E may be included in the element-forming layer 202 in the state illustrated in FIG. 3A. In this case, the emitter pads 82E (FIG. 4D) are disposed on the third-layer emitter line 33E.

The third-layer emitter line 33E in Example 2 is electrically connected to the emitter electrodes 30E, with the second-layer emitter line 32E and the first-layer emitter line 31E being located between the third-layer emitter line 33E and each of the emitter electrodes 30E. In a modification of Example 2, the first-layer emitter lines 31E and the second-layer emitter lines 32E may be eliminated, and the third-layer emitter line 33E may extend through openings in the three interlayer insulating films (i.e., the interlayer insulating films 41, 42, and 43) and be connected directly to the emitter electrodes 30E accordingly. In another modification, the first-layer emitter lines 31E may be eliminated, and the second-layer emitter lines 32E may be connected directly to the emitter electrodes 30E. In still another modification, the second-layer emitter lines 32E may be eliminated, and the third-layer emitter line 33E may be connected directly to the first-layer emitter lines 31E.

Example 3

Figure 7:
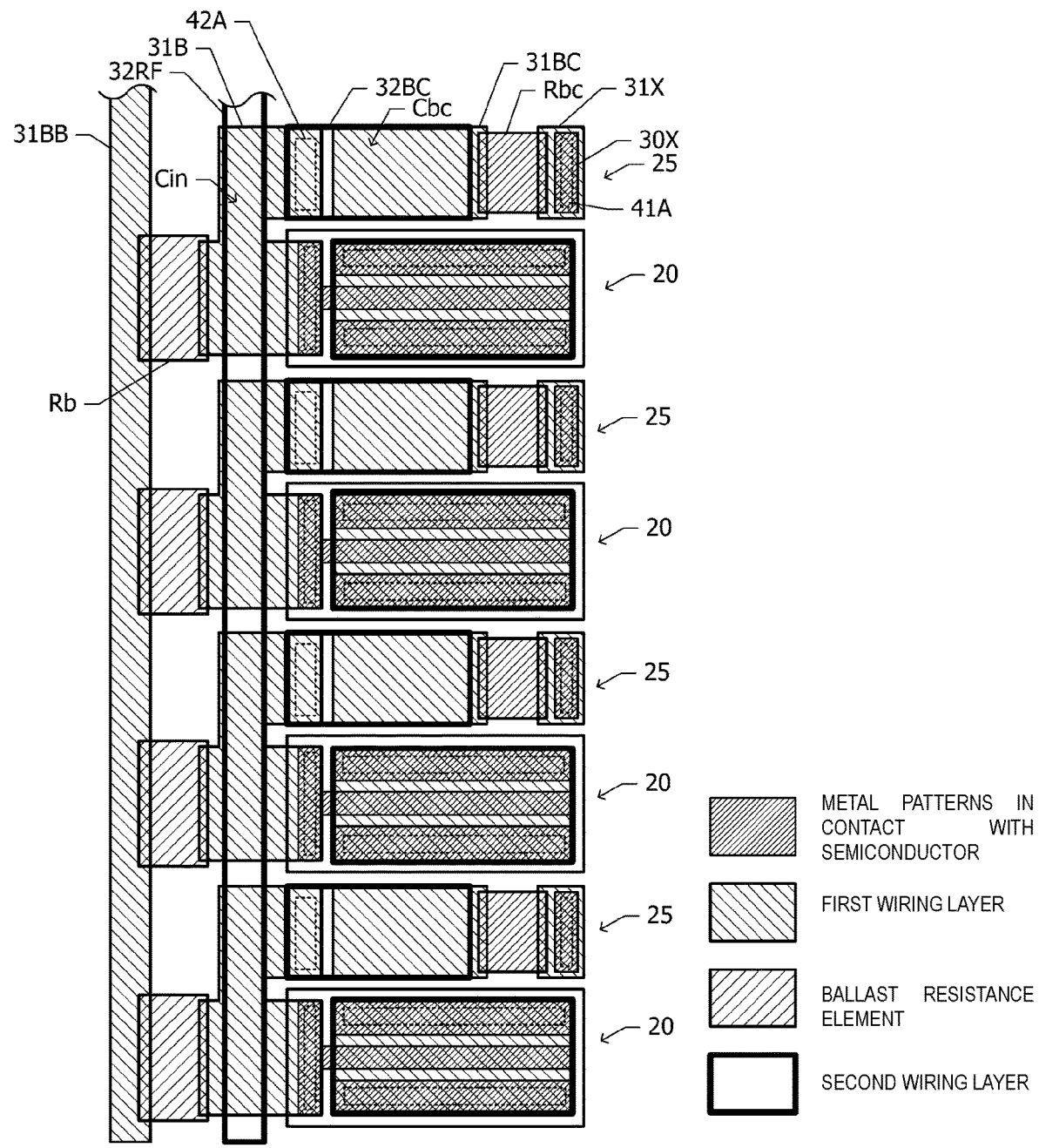
FIG. 7 illustrates the planar positional relationship between constituent elements such as electrodes and wiring of a semiconductor device in Example 3.
Figure 8A:
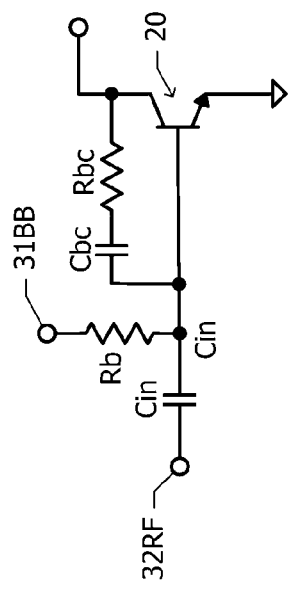
FIG. 8A is a diagram of an equivalent circuit including one of transistors of the semiconductor device in Example 3 and a passive element connected to the transistor.
Figure 8B:
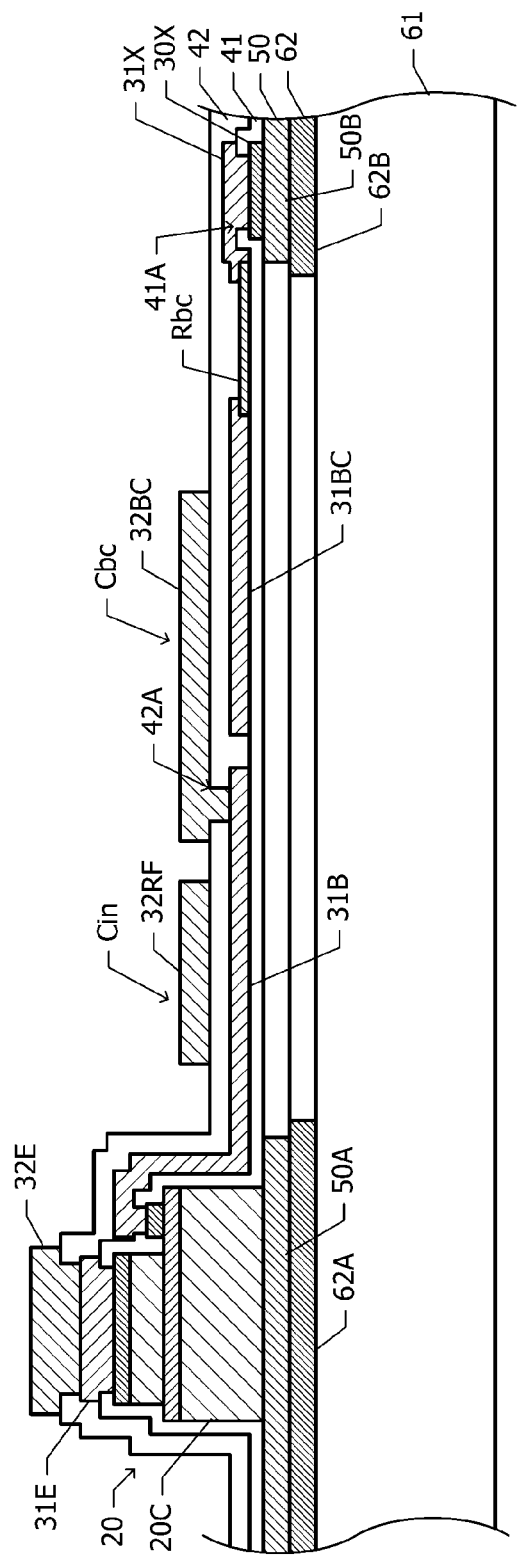
FIG. 8B illustrates a cross-sectional structure representing the connection relationship between one of the transistors of the semiconductor device in Example 3, an input capacitor, a base-collector-junction capacitor, and a base-collector-junction resistance element.

The following describes a semiconductor device in Example 3 with reference to FIGS. 7, 8A, and 8B. The configuration common to the semiconductor device in Example 2 and the semiconductor device in Example 3 is as has been described above with reference to FIGS. 5, 6A, and 6B and will not be further elaborated here.

FIG. 7 illustrates the planar positional relationship between constituent elements such as electrodes and wiring of the semiconductor device in Example 3. In Example 2, the passive elements 25 (see FIG. 5) each located between two adjacent ones of the transistors 20 include the respective emitter-base-junction capacitors Ceb. In Example 3, the passive elements 25 each include a base-collector-junction capacitor Cbc and a base-collector-junction resistance element Rbc.

The base-collector-junction capacitor Cbc includes a lower electrode 31BC in the first wiring layer, an upper electrode 32BC in the second wiring layer, and the second-layer interlayer insulating film 42 (see FIG. 8B) located between the lower electrode 31BC and the upper electrode 32BC. The upper electrode 32BC and the first-layer base line 31B overlap each other when viewed in plan. In the overlapping region, the upper electrode 32BC extends through an opening 42A and is connected to the base line 31B accordingly.

The lower electrode 31BC overlaps one of two opposite end portions of the base-collector-junction resistance element Rbc. The other end portion of the base-collector-junction resistance element Rbc overlaps a conductor pattern 31X, which is included in the first wiring layer. The conductor pattern 31X overlaps a conductor pattern 30X when viewed in plan. The conductor pattern 31X extends through an opening 41A and is connected to the conductor pattern 30X disposed thereunder.

FIG. 8A is a diagram of an equivalent circuit including one of the transistors 20 of the semiconductor device in Example 3 and a passive element connected to the transistor 20. The configuration in Example 3 is similar to the configuration in Example 1 (see FIG. 2A) except that the base-collector-junction capacitor Cbc and the base-collector-junction resistance element Rbc are connected in series between the base and the collector of the transistor 20.

FIG. 8B illustrates a cross-sectional structure representing the connection relationship between one of the transistors 20 of the semiconductor device in Example 3, the corresponding input capacitor Cin, the corresponding base-collector-junction capacitor Cbc, and the corresponding base-collector-junction resistance element Rbc. The connecting structure that forms a connection between the transistor 20 and the input capacitor Cin is similar to the connecting structure in Example 2 (see FIG. 6B).

The bonding layer 62 in Example 3 includes a metal region 62B as well as the metal region 62A. The base semiconductor layer 50 in Example 3 includes a conductive region 50B as well as the conductive region 50A. When viewed in plan, the conductive region 50B and the metal region 62B overlap each other. The conductive region 50B and the metal region 62B are electrically connected to each other. The conductor pattern 30X is disposed on the conductive region 50B. The conductor pattern 30X is electrically connected to the conductive region 50B.

The first wiring layer in this example includes the lower electrode 31BC and the conductor pattern 31X as well as the emitter line 31E and the base line 31B. The conductor pattern 31X extends through the opening 41A in the interlayer insulating film 41 and is connected to the conductor pattern 30X accordingly. The base-collector-junction resistance element Rbc as well as the first wiring layer is disposed on the interlayer insulating film 41. The first wiring layer and the base-collector-junction resistance element Rbc are disposed with no interlayer insulating film therebetween. One of two opposite end portions of the base-collector-junction element Rbc overlaps the lower electrode 31BC and the other end portion overlaps the conductor pattern 31X.

The base-collector-junction resistance element Rbc is electrically connected to the metal region 62B, with the conductor patterns 31X and 30X and the conductive region 50B being located between the base-collector-junction resistance element Rbc and the metal region 62B. The metal region 62B is linked to the metal region 62A by a region not included in the cross section illustrated in FIG. 8B. The region may be a path that connects the conductor pattern 30X and the transistor 20 to each other in the shortest distance when viewed as in FIG. 7. The base-collector-junction resistance element Rbc is electrically connected to the collector layer 20C of the transistor 20 accordingly.

The second wiring layer in this example includes the upper electrode 32BC as well as the emitter line 32E and the radio-frequency signal input line 32RF. The upper electrode 32BC overlaps the lower electrode 31BC when viewed in plan. The upper electrode 32BC extends through the opening 42A in the interlayer insulating film 42 and is connected to the base line 31B accordingly.

The following describes advantageous effects of Example 3.

As with the semiconductor device in Example 2, the semiconductor device in Example 3 achieves a reduction in size and suppresses excessive rises in the temperature of the transistors 20. The base-collector-junction capacitor Cbc and the base-collector-junction resistance element Rbc in Example 3 suppress oscillation such that high stability is achieved with a reduction in distortion. The base-collector-junction resistance element Rbc is optional.

The following describes a modification of Example 3.

In Example 3, the conductor pattern 30X on the base semiconductor layer 50 and the metal region 62B in the bonding layer 62 are electrically connected to each other with the conductive region 50B therebetween. In a modification of Example 3, the base semiconductor layer 50 has an opening, and the conductor pattern 30X extends through the opening and is connected to the metal region 62B accordingly. This configuration enables a reduction in electrical resistance.

Example 4

Figure 9:
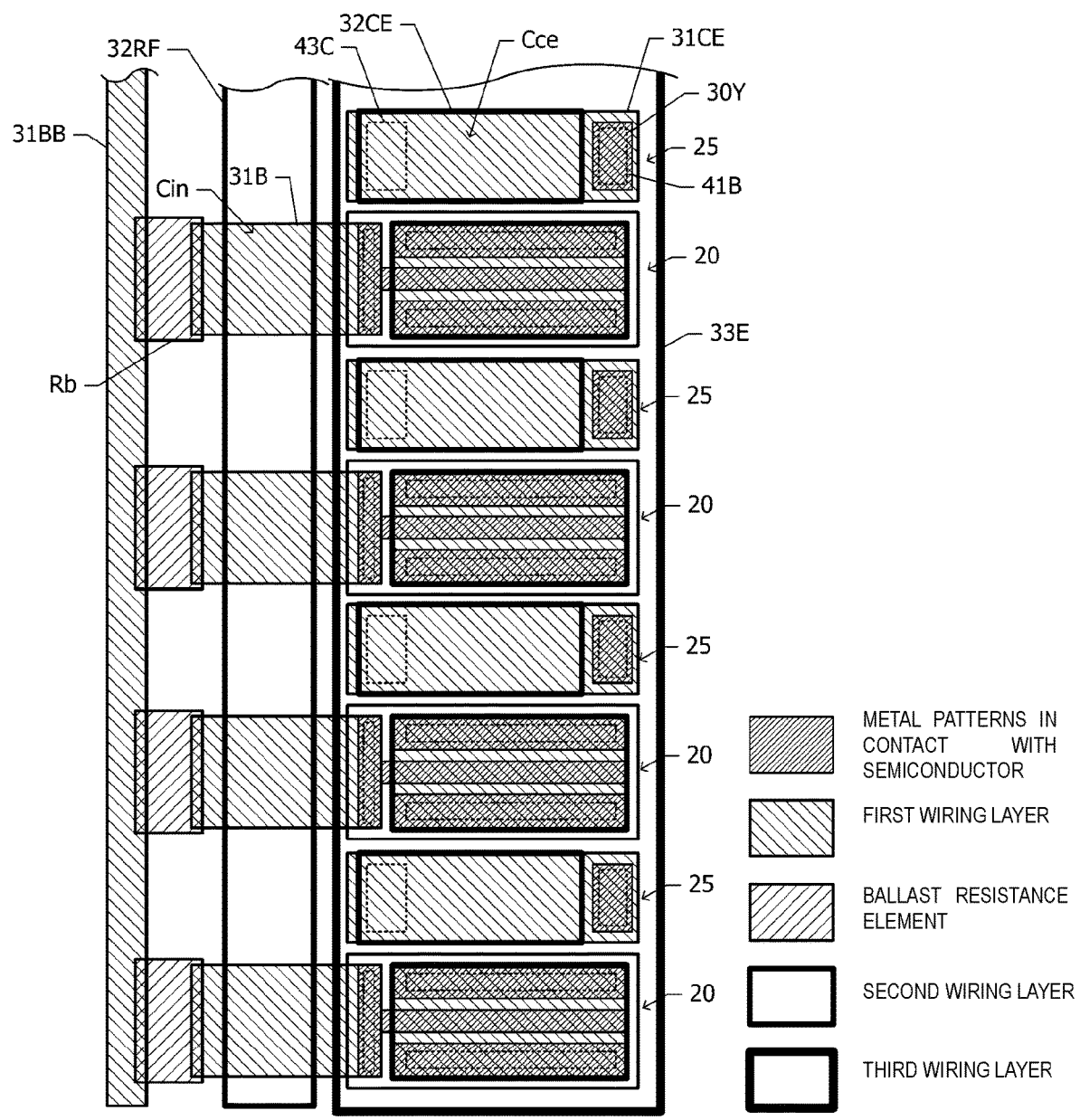
FIG. 9 illustrates the planar positional relationship between constituent elements such as electrodes and wiring of a semiconductor device in Example 4.
Figure 10A:
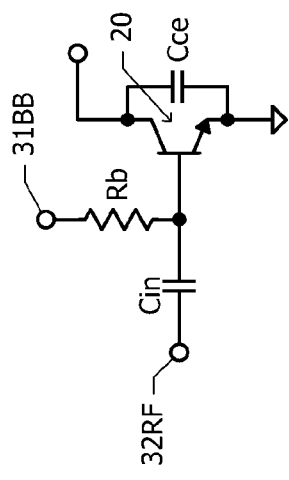
FIG. 10A is a diagram of an equivalent circuit including one of transistors of the semiconductor device in Example 4 and a passive element connected to the transistor.
Figure 10B:
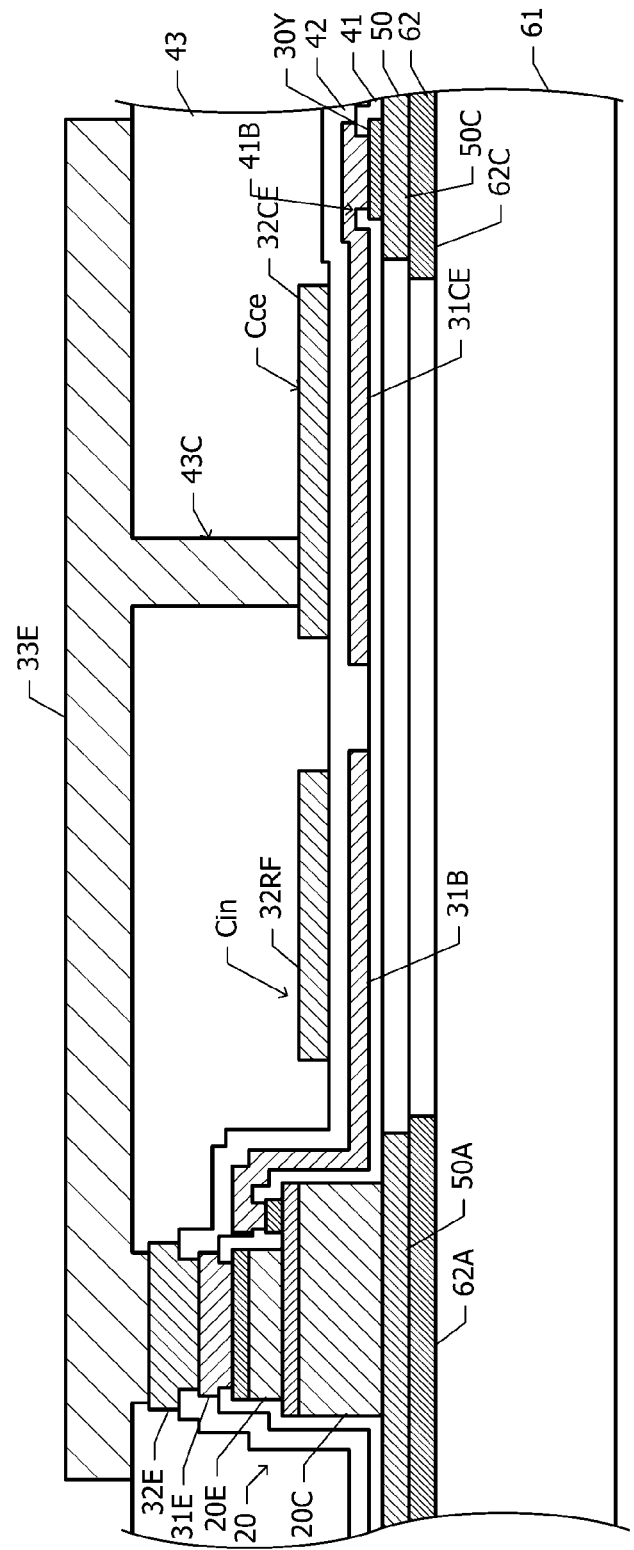
FIG. 10B illustrates a cross-sectional structure representing the connection relationship between one of the transistors of the semiconductor device in Example 4, an input capacitor, and a collector-emitter-junction capacitor.

The following describes a semiconductor device in Example 4 with reference to FIGS. 9, 10A, and 10B. The configuration common to the semiconductor device in Example 2 and the semiconductor device in Example 4 is as has been described above with reference to FIGS. 5, 6A, and 6B and will not be further elaborated here.

FIG. 9 illustrates the planar positional relationship between constituent elements such as electrodes and wiring of the semiconductor device in Example 4. In Example 2, the passive elements 25 (see FIG. 5) each located between two adjacent ones of the transistors 20 include the respective emitter-base-junction capacitors Ceb. In Example 4, the passive elements 25 each include a collector-emitter-junction capacitor Cce.

The collector-emitter-junction capacitor Cce includes a lower electrode 310E in the first wiring layer, an upper electrode 32CE in the second wiring layer, and the interlayer insulating film 42 (see FIG. 10B) located between the lower electrode 310E and the upper electrode 32CE. The third-layer emitter line 33E in this example extends through an opening 43C in the interlayer insulating film 43 disposed thereunder (see FIG. 10B) and is connected to the upper electrode 32CE accordingly.

The lower electrode 310E overlaps a conductor pattern 30Y when viewed in plan. The lower electrode 310E extends through an opening 41B in the interlayer insulating film 41 (see FIG. 10B) disposed thereunder and is connected to the conductor pattern 30Y accordingly.

FIG. 10A is a diagram of an equivalent circuit including one of the transistors 20 of the semiconductor device in Example 4 and a passive element connected to the transistor 20. The configuration in Example 4 is similar to the configuration in Example 1 (see FIG. 2A) except that the collector-emitter-junction capacitor Cce is connected between the collector and the emitter of the transistor 20.

FIG. 10B illustrates a cross-sectional structure representing the connection relationship between one of the transistors 20 of the semiconductor device in Example 4, the corresponding input capacitor Cin, and the corresponding collector-emitter-junction capacitor Cce. The connecting structure that forms a connection between the transistor 20 and the input capacitor Cin is similar to the connecting structure in Example 2 (see FIG. 6B).

The bonding layer 62 in this example includes a metal region 62C as well as the metal region 62A. The base semiconductor layer 50 in this example includes a conductive region 50C as well as the conductive region 50A. When viewed in plan, the conductive region 50C and the metal region 62C overlap each other. The conductive region 50C and the metal region 62C are electrically connected to each other. The conductor pattern 30Y is disposed on the conductive region 50C. The conductor pattern 30Y is electrically connected to the conductive region 50C.

The first wiring layer in this example includes the lower electrode 310E as well as the emitter line 31E and the base line 31B. The lower electrode 310E extends through the opening 41B in the interlayer insulating film 41 and is connected to the conductor pattern 30Y accordingly. The second wiring layer in this example includes the upper electrode 32CE as well as the emitter line 32E and the radio-frequency signal input line 32RF. The upper electrode 32CE and the lower electrode 310E overlap each other when viewed in plan. The collector-emitter-junction capacitor Cce is provided in the overlapping region.

The third-layer emitter line 33E in this example extends through the opening 43C in the third-layer interlayer insulating film 43 and is connected to the upper electrode 32CE accordingly. The third-layer emitter line 33E forms an electrical connection between the emitter layer 20E of the transistor 20 and the upper electrode 32CE of the collector-emitter-junction capacitor Cce.

The metal region 62C is linked to the metal region 62A by a region not included in the cross section illustrated in FIG. 10B. The region may be a path that connects the conductor pattern 30Y and the transistor 20 to each other in the shortest distance when viewed as in FIG. 9. The lower electrode 310E of the collector-emitter-junction capacitor Cce is electrically connected to the collector layer 20C of the transistor 20 accordingly.

The following describes advantageous effects of Example 4.

As with the semiconductor device in Example 2, the semiconductor device in Example 4 achieves a reduction in size and suppresses excessive rises in the temperature of the transistors 20. The collector-emitter-junction capacitor Cce in Example 4 suppress oscillation such that high stability is achieved.

The following describes a modification of Example 4.

In Example 4, the conductor pattern 30Y on the base semiconductor layer 50 and the metal region 62C in the bonding layer 62 are electrically connected to each other with the conductive region 50C therebetween. In a modification of Example 4, the base semiconductor layer 50 has an opening, and the conductor pattern 30Y extends through the opening and is connected to the metal region 62C accordingly. This configuration enables a reduction in electrical resistance.

Example 5

Figure 11:
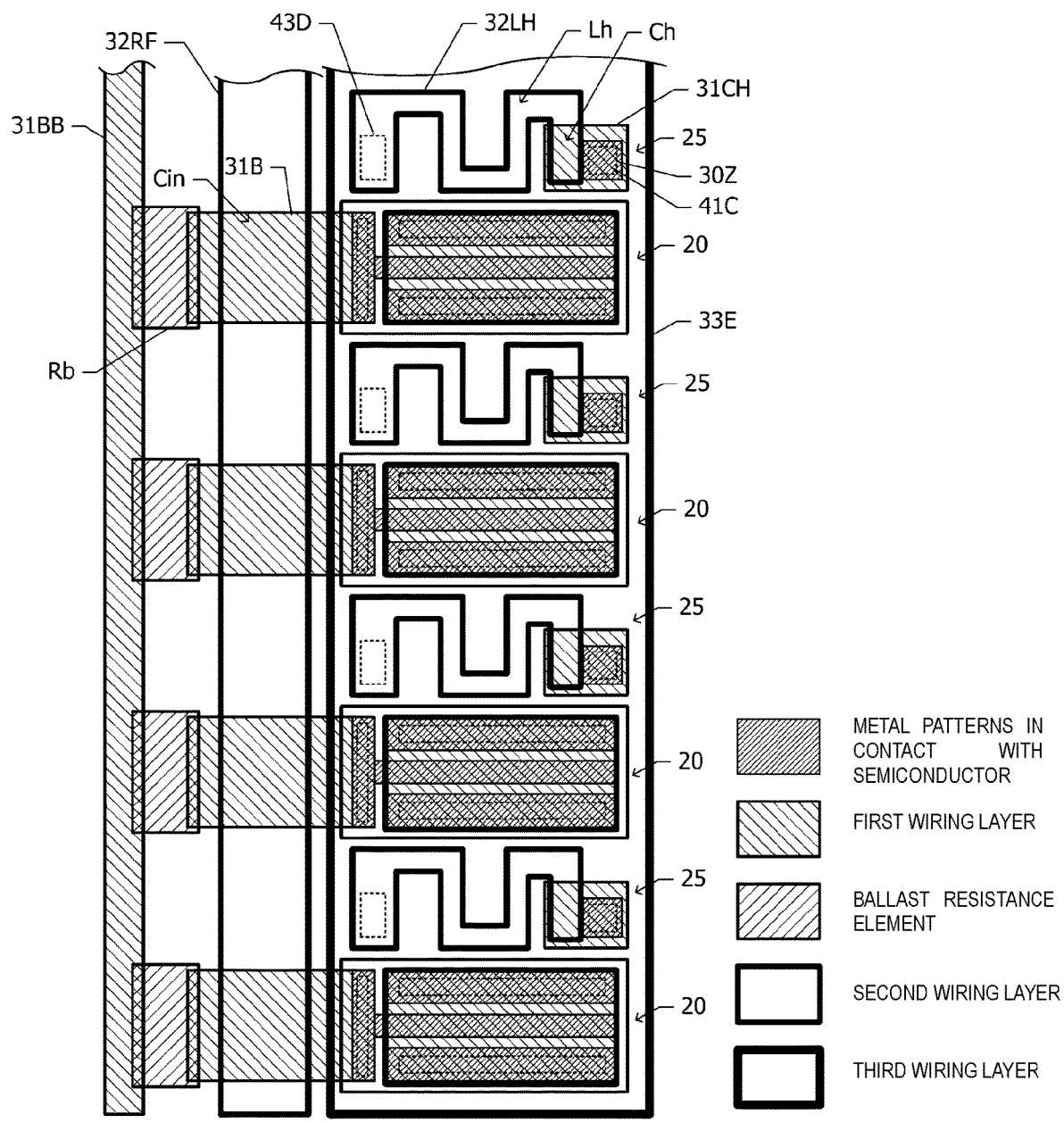
FIG. 11 illustrates the planar positional relationship between constituent elements such as electrodes and wiring of a semiconductor device in Example 5.
Figure 12A:
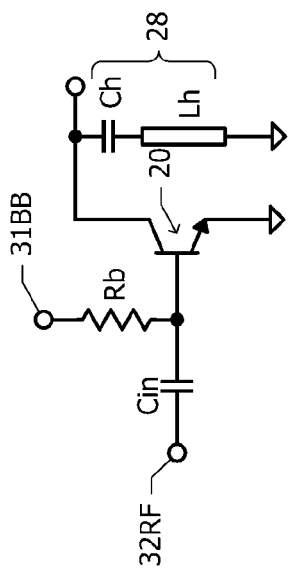
FIG. 12A is a diagram of an equivalent circuit including one of transistors of the semiconductor device in Example 5 and a passive element connected to the transistor.
Figure 12B:
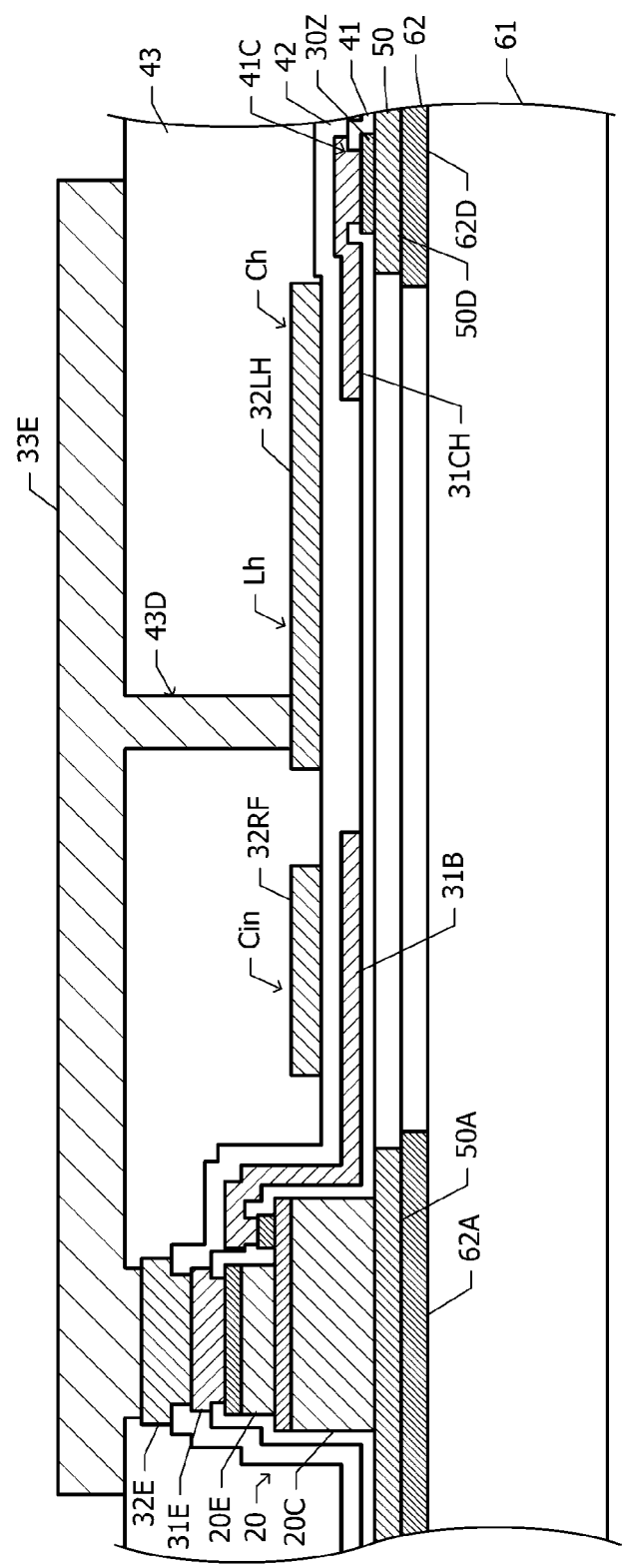
FIG. 12B illustrates a cross-sectional structure representing the connection relationship between one of the transistors of the semiconductor device in Example 5, an input capacitor, an inductor, and another capacitor.

The following describes a semiconductor device in Example 5 with reference to FIGS. 11, 12A, and 12B. The configuration common to the semiconductor device in Example 2 and the semiconductor device in Example 5 is as has been described above with reference to FIGS. 5, 6A, and 6B and will not be further elaborated here.

FIG. 11 illustrates the planar positional relationship between constituent elements such as electrodes and wiring of the semiconductor device in Example 5. In Example 2, the passive elements 25 (see FIG. 5) each located between two adjacent ones of the transistors 20 include the respective emitter-base-junction capacitors Ceb. In Example 5, the passive elements 25 each include a capacitor Ch and an inductor Lh, which constitute a harmonic termination circuit 28. The capacitor Ch and the inductor Lh are connected in series.

The inductor Lh is in the form of a line 32LH, which is included in the second wiring layer and has a meander-like shape. The third-layer emitter line 33E in this example extends through an opening 43D in the interlayer insulating film 43 (see FIG. 12B) disposed thereunder and is connected to one of two opposite end portions of the line 32LH accordingly. When viewed in plan, the other end portion of the line 32LH overlaps a lower electrode 31CH, which is included in the first wiring layer. The capacitor Ch is provided in the overlapping region.

The lower electrode 31CH overlaps a conductor pattern 30Z. The lower electrode 31CH extends through an opening 41C in the interlayer insulating film 41 (see FIG. 12B) disposed thereunder and is connected to the conductor pattern 30Z accordingly.

FIG. 12A is a diagram of an equivalent circuit including one of the transistors 20 of the semiconductor device in Example 5 and a passive element connected to the transistor 20. The configuration in Example 5 is similar to the configuration in Example 1 (see FIG. 2A) except that the capacitor Ch and the inductor Lh constituting the harmonic termination circuit 28 are connected in series between the collector and the ground (emitter) of the transistor 20.

FIG. 12B illustrates a cross-sectional structure representing the connection relationship between one of the transistors 20 of the semiconductor device in Example 5, the corresponding input capacitor Cin, the corresponding inductor Lh, and the corresponding capacitor Ch. The connecting structure that forms a connection between the transistor 20 and the input capacitor Cin is similar to the connecting structure in Example 2 (see FIG. 6B).

The bonding layer 62 in this example includes a metal region 62D as well as the metal region 62A. The base semiconductor layer 50 in this example includes a conductive region 50D as well as the conductive region 50A. When viewed in plan, the conductive region 50D and the metal region 62D overlap each other. The conductive region 50D and the metal region 62D are electrically connected to each other. The conductor pattern 30Z is disposed on the conductive region 50D. The conductor pattern 30Z is electrically connected to the conductive region 50D.

The first wiring layer in this example includes the lower electrode 31CH as well as the emitter line 31E and the base line 31B. The lower electrode 31CH extends through the opening 41C in the interlayer insulating film 41 and is connected to the conductor pattern 30Z accordingly. The second wiring layer in this example includes the line 32LH as well as the emitter line 32E and the radio-frequency signal input line 32RF. One of two opposite end portions of the line 32LH and the lower electrode 31CH overlap each other when viewed in plan. The capacitor Ch is provided in the overlapping region. The line 32LH acts as the inductor Lh.

The third-layer emitter line 33E in this example extends through the opening 43D in the third-layer interlayer insulating film 43 and is connected to the other end portion of the line 32LH accordingly. The third-layer emitter line 33E forms an electrical connection between the emitter layer 20E of the transistor 20 and the inductor Lh.

The metal region 62D is linked to the metal region 62A by a region not included in the cross section illustrated in FIG. 12B. The region may be a path that connects the conductor pattern 30Z and the transistor 20 to each other in the shortest distance when viewed as in FIG. 11. The lower electrode 31CH of the capacitor Ch is electrically connected to the collector layer 20C of the transistor 20 accordingly.

The following describes advantageous effects of Example 5.

As with the semiconductor device in Example 2, the semiconductor device in Example 5 achieves a reduction in size and suppresses excessive rises in the temperature of the transistors 20. The transistors 20 in Example 5 are connected with the respective harmonic termination circuit 28, each of which includes the capacitor Ch and the inductor Lh. The harmonic termination circuits 28 are in close proximity to the respective transistors 20. This layout is conductive to reducing the influence of parasitic inductance. Consequently, the effect of harmonic termination may be enhanced.

The following describes a modification of Example 5.

In Example 5, the conductor pattern 30Z on the base semiconductor layer 50 and the metal region 62D in the bonding layer 62 are electrically connected to each other with the conductive region 50D therebetween. In a modification of Example 5, the base semiconductor layer 50 has an opening, and the conductor pattern 30Z extends through the opening and is connected to the metal region 62D accordingly. This configuration enables a reduction in electrical resistance.

Example 6

Figure 13:
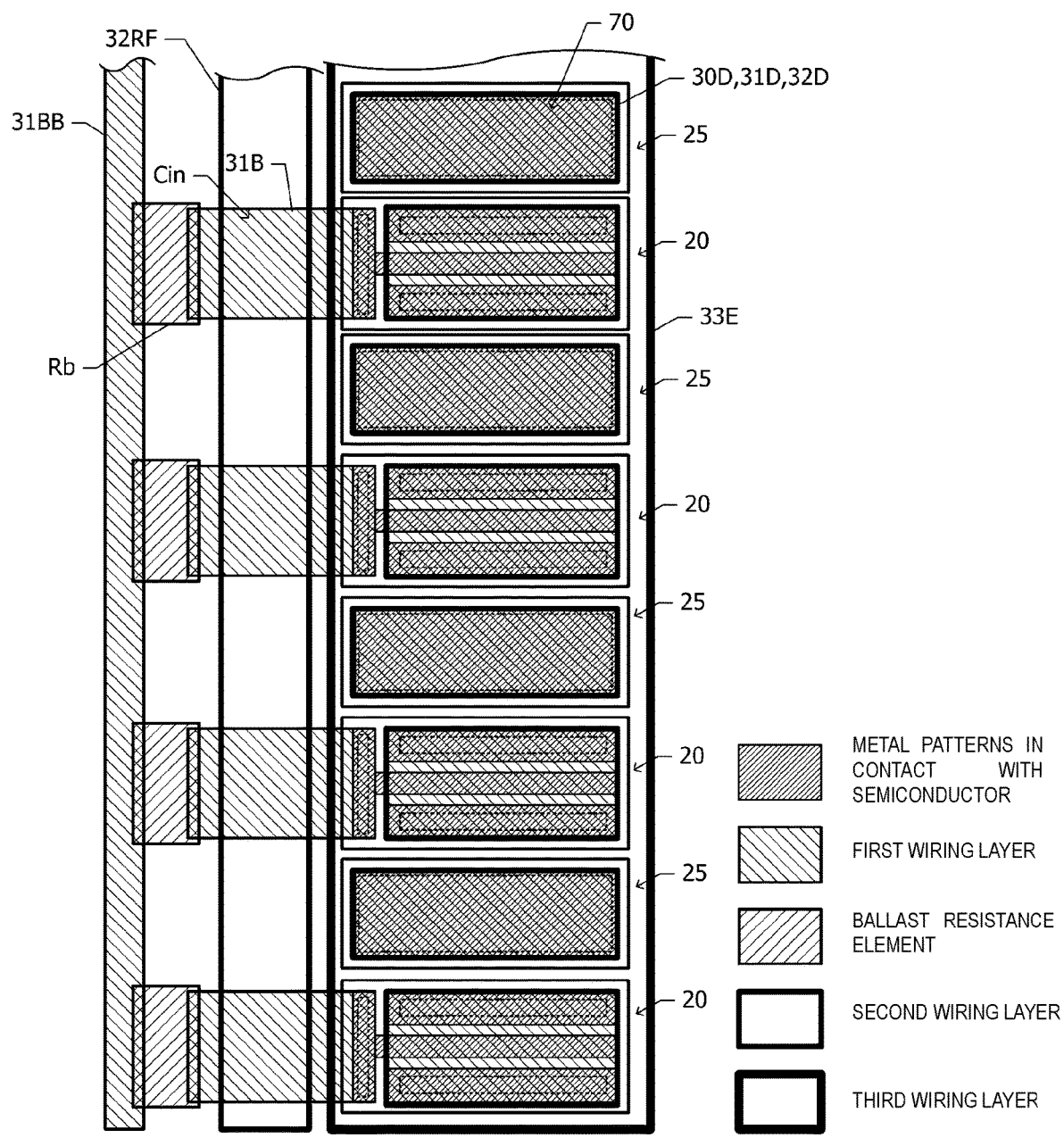
FIG. 13 illustrates the planar positional relationship between constituent elements such as electrodes and wiring of a semiconductor device in Example 6.
Figure 14A:
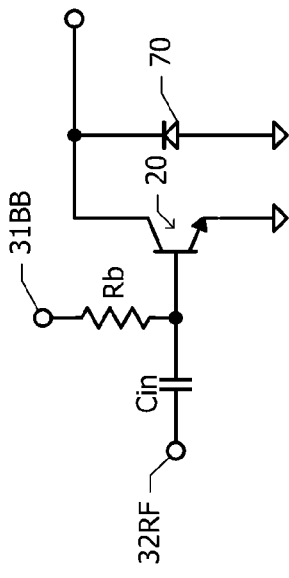
FIG. 14A is a diagram of an equivalent circuit including one of transistors of the semiconductor device in Example 6 and a passive element connected to the transistor.
Figure 14B:
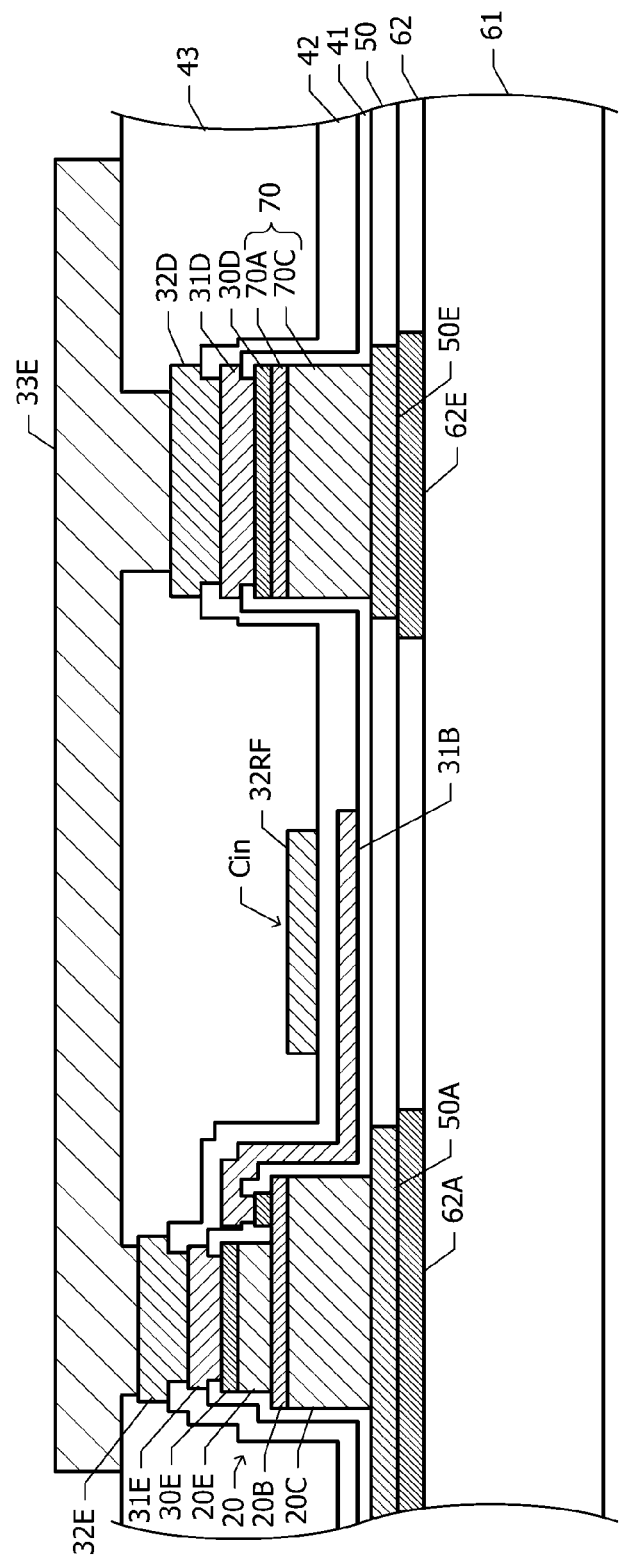
FIG. 14B illustrates a cross-sectional structure representing the connection relationship between one of the transistors of the semiconductor device in Example 6, an input capacitor, and an anti-ESD diode.

The following describes a semiconductor device in Example 6 with reference to FIGS. 13, 14A, and 14B. The configuration common the semiconductor device in Example 2 and the semiconductor device in Example 6 is as has been described above with reference to FIGS. 5, 6A, and 6B and will not be further elaborated here.

FIG. 13 illustrates the planar positional relationship between constituent elements such as electrodes and wiring of the semiconductor device in Example 6. In Example 2, the passive elements 25 (see FIG. 5) each located between two adjacent ones of the transistors 20 include the respective emitter-base-junction capacitors Ceb. In Example 6, the passive elements 25 each include an anti-electrostatic discharge (ESD) diode 70.

The anti-ESD diode 70 includes an upper electrode 30D, which is substantially overlaid with a conductor pattern 31D in the first wiring layer and a conductor pattern 32D in the second wiring layer. The third-layer emitter line 33E extends through an opening in an interlayer insulating film disposed thereunder and is connected to the conductor pattern 32D accordingly.

FIG. 14A is a diagram of an equivalent circuit including one of the transistors 20 of the semiconductor device in Example 6 and a passive element connected to the transistor 20. The configuration in Example 6 is similar to the configuration in Example 1 (see FIG. 2A) except that the anti-ESD diode 70 is connected between the collector and the ground (emitter) of the transistor 20 in such a manner that the forward direction is in the direction from the ground to the collector.

FIG. 14B illustrates a cross-sectional structure representing the connection relationship between one of the transistors 20 of the semiconductor device in Example 6, the corresponding input capacitor Cin, and the corresponding anti-ESD diode 70. The connecting structure that forms a connection between the transistor 20 and the input capacitor Cin is similar to the connecting structure in Example 2 (see FIG. 6B).

The bonding layer 62 in this example includes a metal region 62E as well as the metal region 62A. The base semiconductor layer 50 in this example includes a conductive region 50E as well as the conductive region 50A. When viewed in plan, the conductive region 50E and the metal region 62E overlap each other. The conductive region 50E and the metal region 62E are electrically connected to each other. The anti-ESD diode 70 is disposed on the conductive region 50E. The anti-ESD diode 70 includes a cathode layer 70C and an anode layer 70A. The cathode layer 70C is connected to the conductive region 50E and is overlaid with the anode layer 70A. The cathode layer 70C and the collector layer 20C of the transistor 20 are made of the same semiconductor material or, more specifically, n-type GaAs. The anode layer 70A and the base layer 20B of the transistor 20 are made of the same semiconductor material or, more specifically, p-type GaAs.

The upper electrode 30D is disposed on the anode layer 70A. The upper electrode 30D is electrically connected to the anode layer 70A. The third-layer emitter line 33E is electrically connected to the upper electrode 30D, with the conductor pattern 32D in the second wiring layer and the conductor pattern 31D in the first wiring layer being located between the third-layer emitter line 33E and the upper electrode 30D. The anode layer 70A of the anti-ESD diode 70 is electrically connected to the emitter layer 20E of the transistor 20, with the emitter line 33E being located between the anode layer 70A and the emitter layer 20E.

The cathode layer 70C is electrically connected to the metal region 62E, with the conductive region 50E therebetween. The upper electrode 30D and the metal region 62E act as an anode electrode and a cathode electrode, respectively, of the anti-ESD diode 70.

The metal region 62E is linked to the metal region 62A by a region not included in the cross section illustrated in FIG. 14B. The region may be a path that connects the anti-ESD diode 70 and the transistor 20 to each other in the shortest distance when viewed as in FIG. 13. The cathode layer 70C of the anti-ESD diode 70 is electrically connected to the collector layer 20C of the transistor 20 accordingly.

The following describes advantageous effects of Example 6.

As with the semiconductor device in Example 2, the semiconductor device in Example 6 achieves a reduction in size and suppresses excessive rises in the temperature of the transistors 20. Example 6 is also advantageous in that the transistors 20 are individually protected from ESD.

Figure 15:
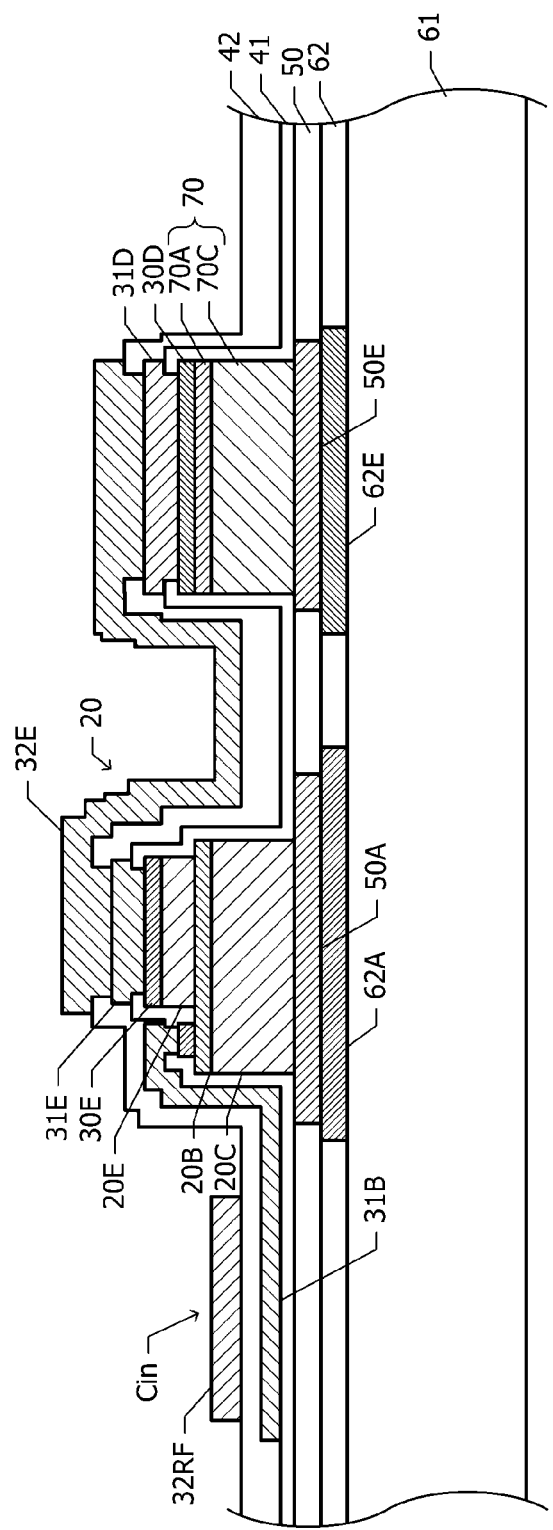
FIG. 15 illustrates a cross-sectional structure representing the connection relationship between one of transistors of a semiconductor device according to a modification of Example 6, an input capacitor, and an anti-ESD diode.

The following describes a modification of Example 6 with reference to FIG. 15.

FIG. 15 illustrates a cross-sectional structure representing the connection relationship between one of the transistors 20 of a semiconductor device according to a modification of Example 6, the corresponding input capacitor Cin, and the corresponding anti-ESD diode 70. When viewed in plan, the third-layer emitter line 33E in Example 6 (see FIG. 14B) extends over the transistor 20 and the anti-ESD diode 70; that is, the third-layer emitter line 33E forms a connection between the transistor 20 and the anti-ESD diode 70. Referring to FIG. 15, when viewed in plan, the second-layer emitter line 32E in this modification extends over the transistor 20 and the anti-ESD diode 70 by passing through a region where the second-layer emitter line 32E does not overlap the radio-frequency signal input line 32RF. This layout eliminates the need for the third-layer emitter line 33E; that is, two wiring layers will suffice.

Figure 16A:
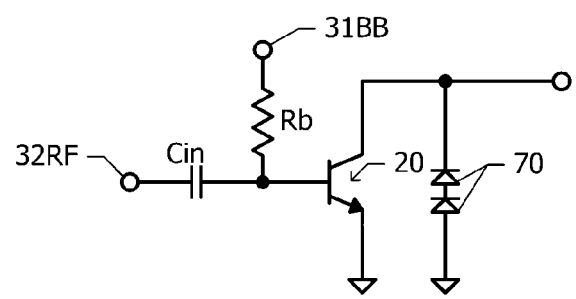
FIG. 16A is a diagram of an equivalent circuit including one of transistors of a semiconductor device according to another modification of Example 6 and a passive element connected to the transistor.
Figure 16B:
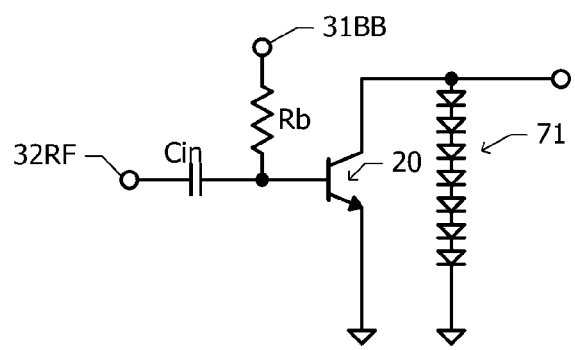
FIG. 16B is a diagram of an equivalent circuit including one of transistors of a semiconductor device according to still another modification of Example 6 and a passive element connected to the transistor.

The following describes other modifications of Example 6 with reference to FIGS. 16A and 16B. FIG. 16A is a diagram of an equivalent circuit including one of the transistors 20 of a semiconductor device according to another modification of Example 6 and a passive element connected to the transistor 20, and FIG. 16B is a diagram of an equivalent circuit including one of the transistors 20 of a semiconductor device according to still another modification of Example 6 and a passive element connected to the transistor 20.

In the modification illustrated in FIG. 16A, two anti-ESD diodes 70 are connected in series. The two anti-ESD diodes 70 are disposed between two transistors 20 that are adjacent to each other when viewed in plan. As in this modification, more than one anti-ESD diode 70 may be connected if necessary.

In the modification illustrated in FIG. 16B, protection diodes 71 are connected in series in such a manner that the forward direction is in the direction from the collector to the ground. The protection diodes 71 are disposed between two transistors 20 that are adjacent to each other when viewed in plan. The number of protection diodes 71 is determined to ensure the satisfaction of the following condition: a series circuit including the protection diodes 71 goes into conduction when the voltage placed between the collector and the emitter of the transistor 20 exceeds an allowable upper limit.

Example 7

Figure 17A:
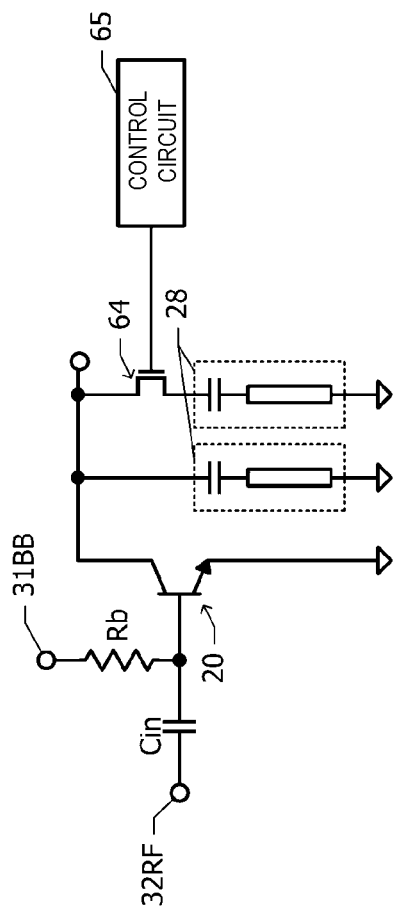
FIG. 17A is a diagram of an equivalent circuit including one of transistors of a semiconductor device in Example 7 and a passive element connected to the transistor.
Figure 17B:
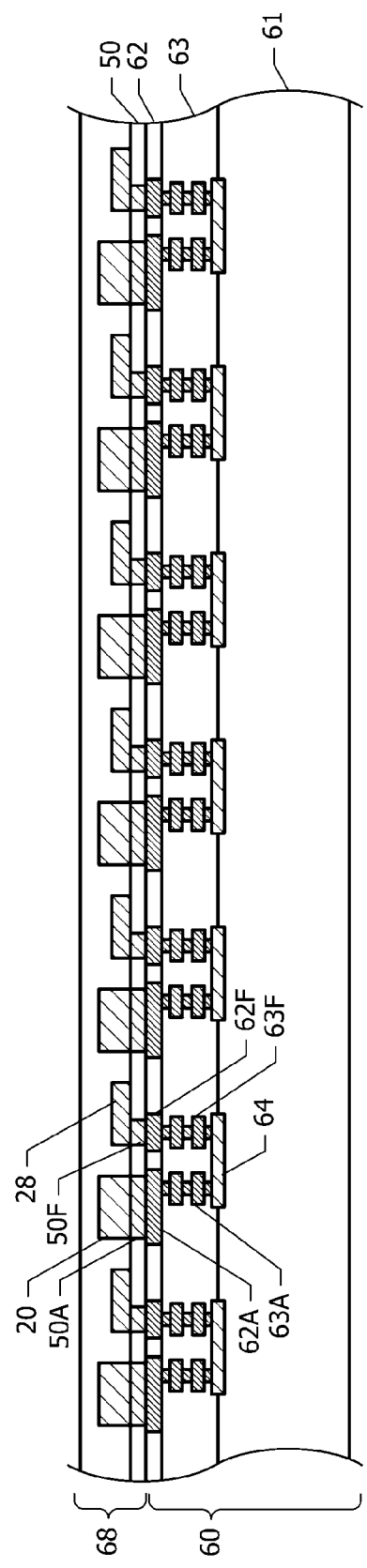
FIG. 17B schematically illustrates a cross-sectional structure of the semiconductor device in Example 7.

The following describes a semiconductor device in Example 7 with reference to FIGS. 17A and 17B. The configuration common to the semiconductor device in Example 5 (see FIGS. 11, 12A, and 12B) and the semiconductor device in Example 7 will not be further elaborated here.

FIG. 17A is a diagram of an equivalent circuit including one of the transistors 20 of the semiconductor device in Example 7 and a passive element connected to the transistor 20. In Example 5 (see FIG. 12A), one harmonic termination circuit 28 is connected between the collector and the ground of the transistor 20. In Example 7, two harmonic termination circuits 28 are connected in parallel. One of the two harmonic termination circuits 28 is provided with a switching element 64, and the harmonic termination circuit 28 and the switching element 64 are connected in series. On-off control of the switching element 64 is performed by a control circuit 65.

FIG. 17B schematically illustrates a cross-sectional structure of the semiconductor device in Example 7. The first member 60 in this example includes the substrate 61, the switching elements 64, a multilayer wiring structure 63 on the substrate 61, the bonding layer 62 on the multilayer wiring structure 63, and the control circuit 65 (see FIG. 17A). The switching elements 64 are provided in a surface layer portion of the substrate 61. The switching elements 64 may, for example, be metal oxide semiconductor field-effect transistors (MOSFETs). Referring to FIG. 17B, part of each rectangle representing the corresponding switching element 64 is located within the substrate 61, and the remaining part of each rectangle juts out from the surface of the substrate 61. This means that the source and the drain of each MOSFET are disposed in a region at a very shallow depth below the surface of the substrate 61, and a gate electrode of each MOSFET is disposed on the surface of the substrate 61.

The control circuit 65 (see FIG. 17A) includes transistors in the surface layer portion of the substrate 61 and wiring in the multilayer wiring structure 63.

The second member 68 in this example includes the base semiconductor layer 50, the transistors 20, and the harmonic termination circuits 28. The transistors 20 and the harmonic termination circuits 28 are disposed on the base semiconductor layer 50. Each of the harmonic termination circuits 28 is disposed between two adjacent ones of the transistors 20. The base semiconductor layer 50 in this example includes conductive regions 50A and conductive regions 50F. The bonding layer 62 in this example includes metal regions 62A and metal regions 62F. There is a one-to-one correspondence between the metal regions 62A and the conductive regions 50A. Likewise, there is a one-to-one correspondence between the metal regions 62F and the conductive regions 50F. The multilayer wiring structure 63 includes conductive members 63A and conductive members 63F, each of which includes vias and inner-layer lands. There is a one-to-one correspondence between the conductive members 63A and the metal regions 62A. Likewise, there is a one-to-one correspondence between the conductive members 63F and the metal regions 62F.

Each conductive region 50A, each metal region 62A, and each conductive member 63A form a connection between the corresponding transistor 20 and the corresponding switching element 64. Each conductive region 50F, each metal region 62F, and each conductive member 63F form a connection between the corresponding harmonic termination circuit 28 and the corresponding switching element 64.

The following describes advantageous effects of Example 7.

As with the semiconductor device in Example 5, the semiconductor device in Example 7 achieves a reduction in size and suppresses excessive rises in the temperature of the transistors 20. This layout is conductive to reducing the influence of parasitic inductance. Consequently, the effect of harmonic termination may be enhanced. Example 7 is also advantageous in that frequencies that are to be the target of harmonic termination may be specified by the turning on and turning off of the switching elements 64.

The following describes modifications of Example 7.

In Example 7, two harmonic termination circuits 28 are connected in parallel between the collector and the ground of the transistor 20. Alternatively, three or more harmonic termination circuits 28 of different channels may be connected in parallel. One of the two harmonic termination circuits 28 in Example 7 is connected with the switching element 64. Alternatively, the harmonic termination circuits 28 may be connected with their respective switching elements 64.

The harmonic termination circuits 28 may be disposed between two adjacent ones of the transistors 20, or only some of the harmonic termination circuits 28 may be disposed between two adjacent ones of the transistors 20.

The on-off control of the switching elements 64 in Example 7 is intended for control of the harmonic termination circuits 28. Alternatively, the on-off control may be intended for control of other circuits including passive elements.

These examples are illustrative. Needless to say, partial replacements or combinations of configurations in different examples are possible. Not every example refers to actions and effects caused by similar configurations. Furthermore, the present disclosure is not intended to be limited to the above-described examples. For example, it will be obvious to those skilled in the art that various changes, improvements, combinations, and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device, comprising:
    a substrate;
    transistors arranged side by side in one direction over a surface of the substrate and connected in parallel, the transistors each including a collector layer over the substrate, a base layer on the collector layer, and an emitter layer on the base layer;
    at least one passive element disposed on at least one of regions between two adjacent ones of the transistors; and
    collector electrodes arranged such that each of the collector electrodes is located between the substrate and the collector layer of a corresponding one of the transistors and is electrically connected to the collector layer,
    wherein the at least one passive element does not overlap each of the collector electrodes in a thickness direction of the semiconductor device.

2. The semiconductor device according to claim 1, wherein
    the at least one passive element includes a first capacitor, and
    with two of the transistors being disposed on opposite sides of the first capacitor, the first capacitor includes an electrode electrically connected to the base layer of one of the two transistors.

3. The semiconductor device according to claim 2, wherein
    the at least one passive element includes a first resistance element, and
    with two of the transistors being disposed on opposite sides of the first resistance element, one of two opposite end portions of the first resistance element is electrically connected to the base layer of one of the two transistors.

4. The semiconductor device according to claim 2, wherein the at least one passive element includes a second capacitor and a second resistance element that are connected in series to constitute a series circuit, and with two of the transistors being disposed on opposite sides of the series circuit including the second capacitor and the second resistance element, the series circuit is electrically connected between the base layer and the collector layer of one of the two transistors.

5. The semiconductor device according to claim 2, wherein the at least one passive element includes a third capacitor, with two of the transistors being disposed on opposite sides of the third capacitor, the third capacitor is electrically connected between the collector layer and the emitter layer of one of the two transistors.

6. The semiconductor device according to claim 2, wherein the at least one passive element includes a fourth capacitor and a fourth inductor that are connected in series to constitute a series circuit, and with two of the transistors being disposed on opposite sides of the series circuit including the fourth capacitor and the fourth inductor, the series circuit is electrically connected between the collector layer and the emitter layer of one of the two transistors.

7. The semiconductor device according to claim 2, further comprising:

an interlayer insulating film that covers the transistors and a region of the substrate on which none of the transistors is disposed, wherein the at least one passive element is disposed on the interlayer insulating film.

8. The semiconductor device according to claim 2, wherein the at least one passive element includes a first diode, and with two of the transistors being disposed on opposite sides of the first diode, the first diode is electrically connected between the collector layer and the emitter layer of one of the two transistors.

9. The semiconductor device according to claim 2, wherein the substrate includes a semiconductor material that is more thermally conductive than semiconductor materials of the collector layers, the base layers, and the emitter layers of the transistors.

10. The semiconductor device according to claim 2, further comprising:

switching elements on the surface of the substrate over which the transistors are disposed, each of the transistors being provided with at least one of the switching elements; and a multilayer wiring structure disposed between the substrate and the collector electrodes in a manner so as to cover the switching elements, wherein the at least one passive element comprises a plurality of passive elements, and the multilayer wiring structure includes conductive members by which the collector electrodes connected to the transistors are connected to the respective passive elements, with at least one of the switching elements being disposed between each of the collector electrodes and a corresponding one of the passive elements.

11. The semiconductor device according to claim 1, wherein the at least one passive element includes a first resistance element, and with two of the transistors being disposed on opposite sides of the first resistance element, one of two opposite end portions of the first resistance element is electrically connected to the base layer of one of the two transistors.

12. The semiconductor device according to claim 11, wherein the at least one passive element includes a second capacitor and a second resistance element that are connected in series to constitute a series circuit, and with two of the transistors being disposed on opposite sides of the series circuit including the second capacitor and the second resistance element, the series circuit is electrically connected between the base layer and the collector layer of one of the two transistors.

13. The semiconductor device according to claim 11, wherein the at least one passive element includes a third capacitor, with two of the transistors being disposed on opposite sides of the third capacitor, the third capacitor is electrically connected between the collector layer and the emitter layer of one of the two transistors.

14. The semiconductor device according to claim 1, wherein the at least one passive element includes a second capacitor and a second resistance element that are connected in series to constitute a series circuit, and with two of the transistors being disposed on opposite sides of the series circuit including the second capacitor and the second resistance element, the series circuit is electrically connected between the base layer and the collector layer of one of the two transistors.

15. The semiconductor device according to claim 1, wherein the at least one passive element includes a third capacitor, with two of the transistors being disposed on opposite sides of the third capacitor, the third capacitor is electrically connected between the collector layer and the emitter layer of one of the two transistors.

16. The semiconductor device according to claim 1, wherein the at least one passive element includes a fourth capacitor and a fourth inductor that are connected in series to constitute a series circuit, and with two of the transistors being disposed on opposite sides of the series circuit including the fourth capacitor and the fourth inductor, the series circuit is electrically connected between the collector layer and the emitter layer of one of the two transistors.

17. The semiconductor device according to claim 1, further comprising:

an interlayer insulating film that covers the transistors and a region of the substrate on which none of the transistors is disposed, wherein the at least one passive element is disposed on the interlayer insulating film.

18. The semiconductor device according to claim 1, wherein the at least one passive element includes a first diode, and with two of the transistors being disposed on opposite sides of the first diode, the first diode is electrically connected between the collector layer and the emitter layer of one of the two transistors.

19. The semiconductor device according to claim 1, wherein the substrate includes a semiconductor material that is more thermally conductive than semiconductor materials of the collector layers, the base layers, and the emitter layers of the transistors.

20. The semiconductor device according to claim 1, further comprising:
switching elements on the surface of the substrate over which the transistors are disposed, each of the transistors being provided with at least one of the switching elements; and
a multilayer wiring structure disposed between the substrate and the collector electrodes in a manner so as to cover the switching elements, wherein
the at least one passive element comprises a plurality of passive elements, and
the multilayer wiring structure includes conductive members by which the collector electrodes connected to the transistors are connected to the respective passive elements, with at least one of the switching elements being disposed between each of the collector electrodes and a corresponding one of the passive elements.

21. A semiconductor device, comprising:
a substrate;
transistors arranged side by side in one direction over a surface of the substrate and connected in parallel, the transistors each including a collector layer over the substrate, a base layer on the collector layer, and an emitter layer on the base layer;
at least one passive element disposed on at least one of regions between two adjacent ones of the transistors;
collector electrodes arranged such that each of the collector electrodes is located between the substrate and the collector layer of a corresponding one of the transistors and is electrically connected to the collector layer; and
an interlayer insulating film that covers the transistors and a region of the substrate on which none of the transistors is disposed, wherein
the at least one passive element is disposed on the interlayer insulating film.

22. A semiconductor device, comprising:
a substrate;
transistors arranged side by side in one direction over a surface of the substrate and connected in parallel, the transistors each including a collector layer over the substrate, a base layer on the collector layer, and an emitter layer on the base layer;
at least one passive element disposed on at least one of regions between two adjacent ones of the transistors;
collector electrodes arranged such that each of the collector electrodes is located between the substrate and the collector layer of a corresponding one of the transistors and is electrically connected to the collector layer;
switching elements on the surface of the substrate over which the transistors are disposed, each of the transistors being provided with at least one of the switching elements; and
a multilayer wiring structure disposed between the substrate and the collector electrodes in a manner so as to cover the switching elements, wherein
the at least one passive element comprises a plurality of passive elements, and
the multilayer wiring structure includes conductive members by which the collector electrodes connected to the transistors are connected to the respective passive elements, with at least one of the switching elements being disposed between each of the collector electrodes and a corresponding one of the passive elements.

* * * * *